(12) United States Patent
Feng et al.

(10) Patent No.: US 11,538,416 B2
(45) Date of Patent: Dec. 27, 2022

(54) SHIFT REGISTER CIRCUIT AND METHOD OF DRIVING THE SAME, GATE DRIVER CIRCUIT, AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); Beijing BOE Technology Development Co., Ltd., Beijing (CN)

(*) Notice: Subject to any disclaimer, the term of this patent is extended or adjusted under 35 U.S.C. 154(b) by 9 days.

(21) Appl. No.: 17/261,652

(22) PCT Filed: Apr. 7, 2020

(86) PCT No.: PCT/CN2020/083521
§ 371 (c)(1),
(2) Date: Jan. 20, 2021

(87) PCT Pub. No.: WO2021/203238
PCT Pub. Date: Oct. 14, 2021

(65) Prior Publication Data
US 2022/0108657 A1 Apr. 7, 2022

(51) Int. Cl.
*G11C 19/00* (2006.01)
*G09G 3/3266* (2016.01)
(Continued)

(52) U.S. Cl.
CPC ............ *G09G 3/3266* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 8,331,524 B2 * 12/2012 Hsu .................. G11C 19/00
377/64
2008/0101529 A1 * 5/2008 Tobita .................. G11C 19/28
377/64
(Continued)

FOREIGN PATENT DOCUMENTS

CN 110660444 1/2020
EP 3825996 5/2021

OTHER PUBLICATIONS

PCT International Search Report for corresponding PCT Application No. PCT/CN2020/083521, dated Jan. 8, 2021, 11 pages.

*Primary Examiner* — Tuan T Lam
(74) *Attorney, Agent, or Firm* — Dority & Manning, P.A.

(57) ABSTRACT

A shift register circuit includes a first input sub-circuit, an output sub-circuit and an output control sub-circuit. The first input sub-circuit transmits a signal received at a second signal input terminal to a pull-up node. The output sub-circuit transmits a signal received at a first clock signal terminal to a shift signal output terminal, and transmits a signal received at an output signal transmission terminal to a first scan signal output terminal. The output control sub-circuit transmits a signal received at a chamfering signal terminal to the first scan signal output terminal in a predetermined time before the first scan signal output terminal stops outputting the signal from the output signal transmission terminal. The chamfering signal terminal transmits a signal with a voltage amplitude within a variation range of a voltage amplitude of a signal of the first scan signal output terminal.

19 Claims, 20 Drawing Sheets

(51) Int. Cl.
*G09G 3/20* (2006.01)
*G09G 3/36* (2006.01)
*G11C 19/28* (2006.01)

(52) U.S. Cl.
CPC ............. *G09G 2310/0286* (2013.01); *G09G 2310/061* (2013.01); *G09G 2310/08* (2013.01)

(56) References Cited

U.S. PATENT DOCUMENTS

| | | | |
|---|---|---|---|
| 2011/0158377 A1 | 6/2011 | Hsu et al. | |
| 2011/0216877 A1 | 9/2011 | Hsu et al. | |
| 2014/0070035 A1* | 3/2014 | Noge | G03G 9/0815 |
| | | | 241/24.25 |
| 2014/0071035 A1 | 3/2014 | Yu et al. | |
| 2014/0219412 A1* | 8/2014 | Chien | G11C 19/28 |
| | | | 377/68 |
| 2015/0043703 A1* | 2/2015 | Tan | G11C 19/184 |
| | | | 377/68 |
| 2015/0339999 A1* | 11/2015 | Zheng | G09G 3/3677 |
| | | | 345/92 |
| 2017/0011699 A1* | 1/2017 | Wang | G11C 19/28 |
| 2018/0190227 A1* | 7/2018 | Feng | G11C 19/28 |
| 2019/0080661 A1* | 3/2019 | Zhao | G11C 19/28 |
| 2019/0108809 A1* | 4/2019 | Zheng | G09G 3/3677 |
| 2019/0318796 A1* | 10/2019 | Xiong | G09G 3/3677 |
| 2020/0020266 A1* | 1/2020 | Feng | G11C 19/28 |
| 2020/0105357 A1 | 4/2020 | Xie et al. | |
| 2021/0142713 A1 | 5/2021 | Feng et al. | |
| 2021/0158742 A1 | 5/2021 | Feng et al. | |
| 2021/0209987 A1* | 7/2021 | Feng | G09G 3/20 |
| 2021/0209994 A1* | 7/2021 | Liang | G11C 19/184 |
| 2021/0210154 A1* | 7/2021 | Feng | G11C 19/28 |
| 2021/0335202 A1* | 10/2021 | Feng | G11C 19/28 |
| 2021/0335266 A1* | 10/2021 | Feng | G09G 3/3266 |
| 2021/0375211 A1* | 12/2021 | Feng | G11C 19/28 |

\* cited by examiner

SHIFT REGISTER CIRCUIT AND METHOD OF DRIVING THE SAME, GATE DRIVER CIRCUIT, AND DISPLAY APPARATUS

CROSS-REFERENCE TO RELATED APPLICATION

This application is a national phase entry under 35 USC 371 of International Patent Application No. PCT/CN2020/083521 filed on Apr. 7, 2020, which is incorporated herein by reference in its entirety.

TECHNICAL FIELD

The present disclosure relates to the field of display technologies, and in particular, to a shift register circuit and a method of driving the same, a gate driver circuit and a display apparatus.

BACKGROUND

GOA (Gate Driver on Array) is a technology that integrates a gate driver circuit onto an array substrate.

SUMMARY

In one aspect, a shift register circuit is provided. The shift register circuit includes a first input sub-circuit, an output sub-circuit and an output control sub-circuit. The first input sub-circuit is coupled to a first signal input terminal, a second signal input terminal and a pull-up node. The first input sub-circuit is configured to transmit a signal received at the second signal input terminal to the pull-up node under control of a signal received at the first signal input terminal. The output sub-circuit is at least coupled to the pull-up node, a first clock signal terminal, an output signal transmission terminal, a shift signal output terminal and a first scan signal output terminal. The output sub-circuit is configured to transmit a signal received at the first clock signal terminal to the shift signal output terminal and to transmit a signal received at the output signal transmission terminal to the first scan signal output terminal in response to a voltage of the pull-up node. The output control sub-circuit is coupled to a second clock signal terminal, a chamfering signal terminal and the first scan signal output terminal. The output control sub-circuit is configured to transmit a signal received at the chamfering signal terminal to the first scan signal output terminal in response to a signal received at the second clock signal terminal in a predetermined time before the first scan signal output terminal stops outputting the signal from the output signal transmission terminal. The chamfering signal terminal is configured to transmit a signal with a voltage amplitude within a variation range of a voltage amplitude of a signal of the first scan signal output terminal.

In some embodiments, the output control sub-circuit includes a first transistor. A control electrode of the first transistor is coupled to the second clock signal terminal, a first electrode of the first transistor is coupled to the chamfering signal terminal, and a second electrode of the first transistor is coupled to the first scan signal output terminal.

In some embodiments, the first input sub-circuit includes a second transistor. A control electrode of the second transistor is coupled to the first signal input terminal, a first electrode of the second transistor is coupled to the second signal input terminal, and a second electrode of the second transistor is coupled to the pull-up node.

In some embodiments, the output sub-circuit includes a third transistor and a fourth transistor. A control electrode of the third transistor is coupled to the pull-up node or the shift signal output terminal, a first electrode of the third transistor is coupled to the output signal transmission terminal, and a second electrode of the third transistor is coupled to the first scan signal output terminal. A control electrode of the fourth transistor is coupled to the pull-up node, a first electrode of the fourth transistor is coupled to the first clock signal terminal, and a second electrode of the fourth transistor is coupled to the shift signal output terminal. In a case where the control electrode of the third transistor is coupled to the pull-up node, the output signal transmission terminal is a third clock signal terminal; or, in a case where the control electrode of the third transistor is coupled to the shift signal output terminal, the output signal transmission terminal is a first voltage terminal.

In some embodiments, the output sub-circuit further includes a first capacitor. In the case where the control electrode of the third transistor is coupled to the pull-up node, a first terminal of the first capacitor is coupled to the pull-up node and the control electrode of the third transistor, and a second terminal of the first capacitor is coupled to the first scan signal output terminal and the second electrode of the third transistor; or, a first terminal of the first capacitor is coupled to the pull-up node and the control electrode of the fourth transistor, and a second terminal of the first capacitor is coupled to the shift signal output terminal and the second electrode of the fourth transistor. Or, in the case where the control electrode of the third transistor is coupled to the shift signal output terminal, a first terminal of the first capacitor is coupled to the pull-up node and the control electrode of the fourth transistor, a second terminal of the first capacitor is coupled to the shift signal output terminal and the second electrode of the fourth transistor.

In some embodiments, the output sub-circuit is further coupled to a fourth clock signal terminal and a second scan signal output terminal. The output sub-circuit is further configured to transmit a signal received at the fourth clock signal terminal to the second scan signal output terminal in response to the voltage of the pull-up node.

In some embodiments, the output sub-circuit includes a fifth transistor and a second capacitor. A control electrode of the fifth transistor is coupled to the pull-up node, a first electrode of the fifth transistor is coupled to the fourth clock signal terminal, and a second electrode of the fifth transistor is coupled to the second scan signal output terminal. A first terminal of the second capacitor is coupled to the pull-up node and the control electrode of the fifth transistor, and a second terminal of the second capacitor is coupled to the second scan signal output terminal and the second electrode of the fifth transistor.

In some embodiments, the shift register circuit further includes a first pull-down control sub-circuit, a first noise reduction sub-circuit, a second noise reduction sub-circuit, a third noise reduction sub-circuit and a first reset sub-circuit. The first pull-down control sub-circuit is coupled to the pull-up node, a first pull-down node, a second voltage terminal and a third voltage terminal. The first pull-down control sub-circuit is configured to transmit a voltage of the second voltage terminal to the first pull-down node under control of a voltage of the first pull-down node, and to transmit a voltage of the third voltage terminal to the first pull-down node under control of the voltage of the third voltage terminal.

The first noise reduction sub-circuit is coupled to the pull-up node, the first pull-down node and the second voltage terminal. The first noise reduction sub-circuit is configured to transmit the voltage of the second voltage terminal to the pull-up node under control of a voltage of the first pull-down node.

The second noise reduction sub-circuit is coupled to the first scan signal output terminal, the first pull-down node and a fourth voltage terminal. The second noise reduction sub-circuit is configured to transmit a voltage of the fourth voltage terminal to the first scan signal output terminal under the control of the voltage of the first pull-down node.

The third noise reduction sub-circuit is coupled to the shift signal output terminal, the first pull-down node and the second voltage terminal. The third noise reduction sub-circuit is configured to transmit the voltage of the second voltage terminal to the shift signal output terminal under the control of the voltage of the first pull-down node.

The first reset sub-circuit is coupled to the pull-up node, a first reset signal terminal and the second voltage terminal. The first reset sub-circuit is configured to transmit the voltage of the second voltage terminal to the pull-up node under control of a signal received at the first reset signal terminal.

In some embodiments, the shift register circuit further includes at least one of a fourth noise reduction sub-circuit or a second reset sub-circuit.

The fourth noise reduction sub-circuit is coupled to a second scan signal output terminal, the first pull-down node and the fourth voltage terminal. The fourth noise reduction sub-circuit is configured to transmit the voltage of the fourth voltage terminal to the second scan signal output terminal under the control of the voltage of the first pull-down node. The output sub-circuit is further coupled to the second scan signal output terminal.

The second reset sub-circuit is coupled to a second reset signal terminal, the pull-up node and the second voltage terminal. The second reset sub-circuit is configured to transmit the voltage of the second voltage terminal to the pull-up node under control of a signal received at the second reset signal terminal.

In some embodiments, the fourth noise reduction sub-circuit includes a twelfth transistor. A control electrode of the twelfth transistor is coupled to the first pull-down node, a first electrode of the twelfth transistor is coupled to the fourth voltage terminal, and a second electrode of the twelfth transistor is coupled to the second scan signal output terminal. The second reset sub-circuit includes a thirteenth transistor. A control electrode of the thirteenth transistor is coupled to the second reset signal terminal, a first electrode of the thirteenth transistor is coupled to the second voltage terminal, and a second electrode of the thirteenth transistor is coupled to the pull-up node.

In some embodiments, the first pull-down control sub-circuit includes a sixth transistor and a seventh transistor. A control electrode and a first electrode of the sixth transistor are coupled to the third voltage terminal, and a second electrode of the sixth transistor is coupled to the first pull-down node. A control electrode of the seventh transistor is coupled to the pull-up node, a first electrode of the seventh transistor is coupled to the second voltage terminal, and a second electrode of the seventh transistor is coupled to the first pull-down node.

The first noise reduction sub-circuit includes an eighth transistor. A control electrode of the eighth transistor is coupled to the first pull-down node, a first electrode of the eighth transistor is coupled to the second voltage terminal, and a second electrode of the eighth transistor is coupled to the pull-up node.

The second noise reduction sub-circuit includes a ninth transistor. A control electrode of the ninth transistor is coupled to the first pull-down node, a first electrode of the ninth transistor is coupled to the fourth voltage terminal, and a second electrode of the ninth transistor is coupled to the first scan signal output terminal.

The third noise reduction sub-circuit includes a tenth transistor. A control electrode of the tenth transistor is coupled to the first pull-down node, a first electrode of the tenth transistor is coupled to the second voltage terminal, and a second electrode of the tenth transistor is coupled to the shift signal output terminal.

The first reset sub-circuit includes an eleventh transistor. A control electrode of the eleventh transistor is coupled to the first reset signal terminal, a first electrode of the eleventh transistor is coupled to the second voltage terminal, and a second electrode of the eleventh transistor is coupled to the pull-up node.

In some embodiments, the shift register circuit further includes a second pull-down control sub-circuit, a fifth noise reduction sub-circuit, a sixth noise reduction sub-circuit and a seventh noise reduction sub-circuit. The second pull-down control sub-circuit is coupled to the pull-up node, a second pull-down node, the second voltage terminal and a fifth voltage terminal. The second pull-down control sub-circuit is configured to transmit the voltage of the second voltage terminal to the second pull-down node under control of the voltage of the pull-up node, and to transmit a voltage of the fifth voltage terminal to the second pull-down node under control of the voltage of the fifth voltage terminal.

The fifth noise reduction sub-circuit is coupled to the pull-up node, the second pull-down node and the second voltage terminal. The fifth noise reduction sub-circuit is configured to transmit the voltage of the second voltage terminal to the pull-up node under control of a voltage of the second pull-down node.

The sixth noise reduction sub-circuit is coupled to the first scan signal output terminal, the second pull-down node and the fourth voltage terminal. The sixth noise reduction sub-circuit is configured to transmit the voltage of the fourth voltage terminal to the first scan signal output terminal under control of the voltage of the second pull-down node.

The seventh noise reduction sub-circuit is coupled to the shift signal output terminal, the second pull-down node and the second voltage terminal. The seventh noise reduction sub-circuit is configured to transmit the voltage of the second voltage terminal to the shift signal output terminal under control of the voltage of the second pull-down node.

Or, the shift register circuit further includes a second pull-down control sub-circuit, a fifth noise reduction sub-circuit, a sixth noise reduction sub-circuit, a seventh noise reduction sub-circuit and an eighth noise reduction sub-circuit.

The second pull-down control sub-circuit is coupled to the pull-up node, a second pull-down node, the second voltage terminal and a fifth voltage terminal. The second pull-down control sub-circuit is configured to transmit the voltage of the second voltage terminal to the second pull-down node under control of the voltage of the pull-up node, and to transmit a voltage of the fifth voltage terminal to the second pull-down node under control of the voltage of the fifth voltage terminal.

The fifth noise reduction sub-circuit is coupled to the pull-up node, the second pull-down node and the second voltage terminal. The fifth noise reduction sub-circuit is configured to transmit the voltage of the second voltage terminal to the pull-up node under control of a voltage of the second pull-down node.

The sixth noise reduction sub-circuit is coupled to the first scan signal output terminal, the second pull-down node and the fourth voltage terminal. The sixth noise reduction sub-circuit is configured to transmit the voltage of the fourth voltage terminal to the first scan signal output terminal under control of the voltage of the second pull-down node.

The seventh noise reduction sub-circuit is coupled to the shift signal output terminal, the second pull-down node and the second voltage terminal. The seventh noise reduction sub-circuit is configured to transmit the voltage of the second voltage terminal to the shift signal output terminal under control of the voltage of the second pull-down node.

The eighth noise reduction sub-circuit is coupled to a second scan signal output terminal, the second pull-down node and the fourth voltage terminal. The eighth noise reduction sub-circuit is configured to transmit the voltage of the fourth voltage terminal to the second scan signal output terminal under control of the voltage of the second pull-down node. The output sub-circuit is further coupled to the second scan signal output terminal.

In some embodiments, the second pull-down control sub-circuit includes a fourteenth transistor and a fifteenth transistor. A control electrode and a first electrode of the fourteenth transistor are coupled to the fifth voltage terminal, and a second electrode of the fourteenth transistor is coupled to the second pull-down node. A control electrode of the fifteenth transistor is coupled to the pull-up node, a first electrode of the fifteenth transistor is coupled to the second voltage terminal, and a second electrode of the fifteenth transistor is coupled to the second pull-down node.

The fifth noise reduction sub-circuit includes a sixteenth transistor. A control electrode of the sixteenth transistor is coupled to the second pull-down node, a first electrode of the sixteenth transistor is coupled to the second voltage terminal, and a second electrode of the sixteenth transistor is coupled to the pull-up node.

The sixth noise reduction sub-circuit includes a seventeenth transistor. A control electrode of the seventeenth transistor is coupled to the second pull-down node, a first electrode of the seventeenth transistor is coupled to the fourth voltage terminal, and a second electrode of the seventeenth transistor is coupled to the first scan signal output terminal.

The seventh noise reduction sub-circuit includes an eighteenth transistor. A control electrode of the eighteenth transistor is coupled to the second pull-down node, a first electrode of the eighteenth transistor is coupled to the second voltage terminal, and a second electrode of the eighteenth transistor is coupled to the shift signal output terminal.

In some embodiments, the eighth noise reduction sub-circuit includes a nineteenth transistor. A control electrode of the nineteenth transistor is coupled to the second pull-down node, a first electrode of the nineteenth transistor is coupled to the fourth voltage terminal, and a second electrode of the nineteenth transistor is coupled to the second scan signal output terminal.

In some embodiments, the shift register circuit further includes a second input sub-circuit, a compensation sub-circuit and a storage sub-circuit. The second input sub-circuit is coupled to a control signal terminal, the first signal input terminal and a first node. The second input sub-circuit is configured to transmit the signal received at the first signal input terminal to the first node under control of a signal received at the control signal terminal. The compensation sub-circuit is coupled to a fifth clock signal terminal, the first node and the pull-up node. The compensation sub-circuit is configured to transmit a signal received at the fifth clock signal terminal to the pull-up node under control of a voltage of the first node and the signal received at the fifth clock signal terminal. The storage sub-circuit is coupled to a sixth voltage terminal and the first node. The storage sub-circuit is configured to store a signal that is transmitted to the first node from the first the first signal input terminal.

In some embodiments, the second input sub-circuit includes a twentieth transistor. A control electrode of the twentieth transistor is coupled to the control signal terminal, a first electrode of the twentieth transistor is coupled to the first signal input terminal, and a second electrode of the twentieth transistor is coupled to the first node.

The compensation sub-circuit includes a twenty-first transistor and a twenty-second transistor. A control electrode of the twenty-first transistor is coupled to the first node, and a first electrode of the twenty-first transistor is coupled to the fifth clock signal terminal. A control electrode of the twenty-second transistor is coupled to the fifth clock signal terminal, a first electrode of the twenty-second transistor is coupled to a second electrode of the twenty-first transistor, and a second electrode of the twenty-second transistor is coupled to the pull-up node.

The storage sub-circuit includes a third capacitor. A first terminal of the third capacitor is coupled to the sixth voltage terminal, and a second terminal of the third capacitor is coupled to the first node.

In some embodiments, the shift register circuit further includes a first potential boosting sub-circuit and a second potential boosting sub-circuit. The first potential boosting sub-circuit is coupled to a seventh voltage terminal, the pull-up node and a second node. The first potential boosting sub-circuit is configured to transmit a voltage of the seventh voltage terminal to the second node under control of the voltage of the pull-up node. The second node is coupled to the compensation sub-circuit. The second potential boosting sub-circuit is coupled to the seventh voltage terminal, the first node and the second input sub-circuit. The second potential boosting sub-circuit is configured to transmit the voltage of the seventh voltage terminal to the second input sub-circuit under the control of the voltage of the first node.

In some embodiments, the first potential boosting sub-circuit includes a twenty-seventh transistor. A control electrode of the twenty-seventh transistor is coupled to the pull-up node, a first electrode of the twenty-seventh transistor is coupled to the seventh voltage terminal, and a second electrode of the twenty-seventh transistor is coupled to the second node. The second potential boosting sub-circuit includes a twenty-eighth transistor. A control electrode of the twenty-eighth transistor is coupled to the first node, a first electrode of the twenty-eighth transistor is coupled to the seventh voltage terminal, and a second electrode of the twenty-eighth transistor is coupled to the second input sub-circuit.

In some embodiments, the shift register circuit further includes a first pull-down control sub-circuit, a first control sub-circuit and a second control sub-circuit. The first pull-down control sub-circuit is coupled to the pull-up node, a first pull-down node, a second voltage terminal and a third voltage terminal. The first pull-down control sub-circuit is configured to transmit a voltage of the second voltage terminal to the first pull-down node under control of a voltage of the first pull-down node, and to transmit a voltage of the third voltage terminal to the first pull-down node under control of the voltage of the third voltage terminal. The first control sub-circuit is coupled to a fifth clock signal terminal, the second voltage terminal and the first pull-down node. The first control sub-circuit is configured to transmit a voltage of the second voltage terminal to the first pull-down node under control of a signal received at the fifth clock signal terminal. The second control sub-circuit is coupled to the first signal input terminal, the second voltage terminal and the first pull-down node. The second control sub-circuit is configured to transmit the voltage of the second voltage terminal to the first pull-down node under the control of the signal received at the first signal input terminal.

In some embodiments, the shift register circuit further includes a second pull-down control sub-circuit, a third control sub-circuit and a fourth control sub-circuit. The second pull-down control sub-circuit is coupled to the pull-up node, a second pull-down node, the second voltage terminal and a fifth voltage terminal. The second pull-down control sub-circuit is configured to transmit the voltage of the second voltage terminal to the second pull-down node under control of the voltage of the pull-up node, and to transmit a voltage of the fifth voltage terminal to the second pull-down node under control of the voltage of the fifth voltage terminal. The third control sub-circuit is coupled to the fifth clock signal terminal, the second voltage terminal and the second pull-down node. The third control sub-circuit is configured to transmit a voltage of the second voltage terminal to the second pull-down node under control of the signal received at the fifth clock signal terminal. The fourth control sub-circuit is coupled to the first signal input terminal, the second voltage terminal and the second pull-down node. The fourth control sub-circuit is configured to transmit the voltage of the second voltage terminal to the second pull-down node under the control of the signal received at the first signal input terminal.

In some embodiments, the first control sub-circuit includes a twenty-third transistor. A control electrode of the twenty-third transistor is coupled to the fifth clock signal terminal, a first electrode of the twenty-third transistor is coupled to the second voltage terminal, a second electrode of the twenty-third transistor is coupled to the first pull-down node. The second control sub-circuit includes a twenty-fourth transistor. A control electrode of the twenty-fourth transistor is coupled to the first signal input terminal, a first electrode of the twenty-fourth transistor is coupled to the second voltage terminal, and a second electrode of the twenty-fourth transistor is coupled to the first pull-down node.

The third control sub-circuit includes a twenty-fifth transistor. A control electrode of the twenty-fifth transistor is coupled to the fifth clock signal terminal, a first electrode of the twenty-fifth transistor is coupled to the second voltage terminal, and a second electrode of the twenty-fifth transistor is coupled to the second pull-down node. The fourth control sub-circuit includes a twenty-sixth transistor. A control electrode of the twenty-sixth transistor is coupled to the first signal input terminal, a first electrode of the twenty-sixth transistor is coupled to the second voltage terminal, and a second electrode of the twenty-sixth transistor is coupled to the second pull-down node.

In another aspect, a gate driver circuit is provided. The gate driver circuit includes a plurality of shift register circuits according to any one of the above embodiments connected in cascade.

In yet another aspect, a display apparatus is provided. The display apparatus includes the gate driver circuit according to the above embodiment.

In yet another aspect, a method of driving the shift register circuit according to any one of the above embodiments is provided. The method includes: transmitting, by the first input sub-circuit, the signal received at the second signal input terminal to the pull-up node under the control of the signal received at the first signal input terminal; transmitting, by the output sub-circuit, the signal received at the first clock signal terminal to the shift signal output terminal, and the signal received at the output signal transmission terminal to the first scan signal output terminal in response to the voltage of the pull-up node; and transmitting, by the output control sub-circuit, the signal received at the chamfering signal terminal to the first scan signal output terminal in response to the signal received at the second clock signal terminal in the predetermined time before the first scan signal output terminal stops outputting the signal from the output signal transmission terminal. The voltage amplitude of the signal received at the chamfering signal terminal is within the variation range of the voltage amplitude of the signal of the first scan signal output terminal.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual dimensions of products, actual processes of methods and actual timings of signals that the embodiments of the present disclosure relate to.

DETAILED DESCRIPTION

Figure 1:
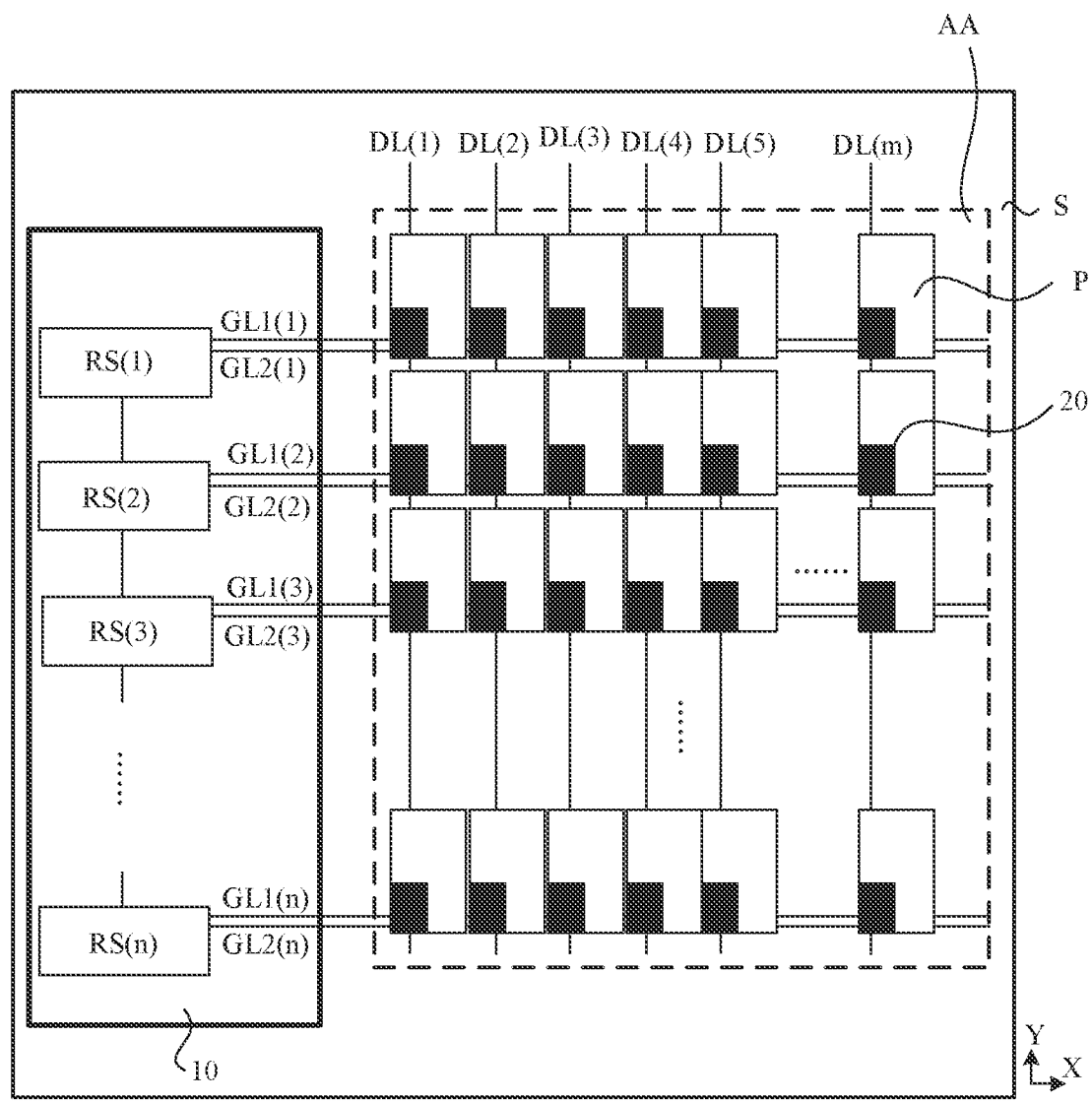
FIG. 1 is a diagram showing a structure of a display panel, in accordance with some embodiments.

Technical solutions in some embodiments of the present disclosure will be described below clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a/the plurality of" means two or more unless otherwise specified.

Some embodiments may be described using the expressions "coupled" and "connected" along with their derivatives. For example, some embodiments may be described using the term "connected" to indicate that two or more elements are in direct physical contact or electrical contact with each other. In another example, some embodiments may be described using the term "coupled" to indicate that two or more components are in direct physical or electrical contact. The term "coupled" or "communicatively coupled", however, may also mean that two or more components are not in direct contact with each other, but yet still co-operate or interact with each other. The embodiments disclosed herein are not necessarily limited to the content herein.

"At least one of A, B, and C" has a same meaning as "at least one of A, B, or C", and both include the following combinations of A, B, and C: only A, only B, only C, a combination of A and B, a combination of A and C, a combination of B and C, and a combination of A, B, and C.

As used herein, the term "if" is, optionally, construed to mean "when" or "upon" or "in response to determining" or "in response to detecting", depending on the context. Similarly, the phrases "if it is determined that . . . " or "if [a stated condition or event] is detected" is, optionally, construed to mean "upon determining that . . . " or "in response to determining that . . . " or "upon detecting [the stated condition or event]" or "in response to detecting [the stated condition or event]", depending on the context.

The use of "adapted to" or "configured to" herein is meant as an open and inclusive language that does not foreclose devices adapted to or configured to perform additional tasks or steps.

Embodiments of the present disclosure provide a display apparatus.

The display apparatus includes a display panel 100 as shown in FIG. 1. The display panel 100 has an active area (AA) and a peripheral area S at least located on one side of the active area AA.

As shown in FIG. 1, the display panel 100 includes a plurality of sub-pixels P disposed in the AA. In some embodiments, the plurality of sub-pixels P at least include sub-pixels of a first color, sub-pixels of a second color and sub-pixels of a third color, and the first color, the second color and the third color are three primary colors such as red, green and blue.

It will be noted that, FIG. 1 is an illustration by taking an example in which the plurality of sub-pixels P are arranged in an array of n rows and m columns, but embodiments of the present disclosure are not limited thereto, and the plurality of sub-pixels P may be arranged in other manners. Sub-pixels P arranged in a row in a horizontal direction X are referred to as sub-pixels in a same row. Sub-pixels P arranged in a column in a vertical direction Y are referred to as sub-pixels in a same column.

As shown in FIG. 1, a plurality of first scan signal lines GL1(1) to GL1($n$), a plurality of second scan signal lines GL2(1) to GL2($n$) and a plurality of data signal lines DL(1) to DL(m) are provided in the display panel 100. For example, the first scan signal lines GL1 and the second scan signal lines GL2 extend in the horizontal direction X, and the data signal lines DL extend in the vertical direction Y.

In some embodiments, as shown in FIG. 1, a gate driver circuit 10 is provided in the peripheral area S of the display panel 100. The gate driver circuit 10 includes a plurality of shift register circuits RS(1) to RS(n).

A shift register circuit RS is coupled to a first scan signal line GL1 and a second scan signal line GL2.

In some embodiments, as shown in FIG. 1, a pixel driving circuit 20 is provided in a sub-pixel P.

Figure 2:
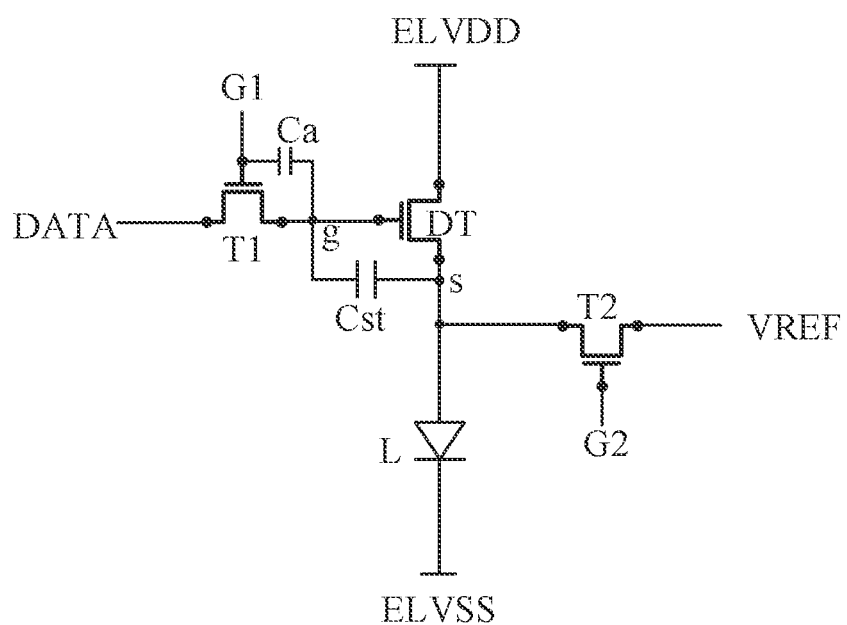
FIG. 2 is a diagram showing a structure of a pixel driving circuit, in accordance with some embodiments.

As shown in FIG. 2, the pixel driving circuit 20 is coupled to a light-emitting device L, and the pixel driving circuit 20 is used for driving the light-emitting device L to emit light.

For example, the light-emitting device L includes an OLED (Organic Light-Emitting Diode).

In some embodiments, as shown in FIG. 2, the pixel driving circuit 20 includes a storage capacitor Cst, a parasitic capacitor Ca, a first switching transistor T1, a second switching transistor T2 and a driving transistor DT.

A control electrode of the first switching transistor T1 is coupled to a first scan signal terminal G1, and a first electrode of the first switching transistor T1 is coupled to a data signal terminal DATA. A control electrode of the second switching transistor T2 is coupled to a second scan signal terminal G2, and a first electrode of the second switching transistor T2 is coupled to a reference signal terminal VREF. A control electrode g of the driving transistor DT is coupled to a second electrode of the first switching transistor T1, and a first electrode of the driving transistor DT is coupled to a first power voltage signal terminal ELVDD. A second electrode s of the driving transistor DT is coupled to a second electrode of the second switching transistor T2. A first terminal of the storage capacitor Cst is coupled to the control electrode of the driving transistor DT, and a second terminal of the storage capacitor Cst is coupled to the second electrode s of the driving transistor DT. A first terminal of the parasitic capacitor Ca is coupled to the control electrode of the first switching transistor T1, and a second terminal of the parasitic capacitor Ca is coupled to the second electrode of the first switching transistor T1. That is, the parasitic capacitor Ca is a parasitic capacitor formed between the control electrode and the second electrode of the first switching transistor T1.

A first electrode of the light-emitting device L is coupled to the second electrode s of the driving transistor DT, and a second electrode of the light-emitting device L is coupled to a second power voltage signal terminal ELVSS.

The first scan signal line GL1 provides a first scan signal for the first scan signal terminal G1, the second scan signal line GL2 provides a second scan signal for the second scan signal terminal G2, and a data signal line DL provides a data signal for the data signal terminal DATA.

In the related art, the control electrode of the first switching transistor T1 is coupled to the first scan signal terminal G1, and the second electrode of the first switching transistor T1 is coupled to the control electrode g of the driving transistor DT and the first terminal of the storage capacitor Cst, and therefore, the parasitic capacitor Ca is coupled to the storage capacitor Cst, and the parasitic capacitor Ca transmits a signal received at the first scan signal terminal G1 to the control electrode g of the driving transistor DT and the first terminal of the storage capacitor Cst. In this case, a change gradient of a potential the signal received at the first scan signal terminal G1 is too large, for example, a time for the potential of the signal received at the first scan signal terminal G1 to change from a high level to a low level is too short. As a result, a potential of the control electrode g of the driving transistor DT will change abruptly, causing a potential difference between the control electrode g (i.e., gate) and the second electrode s (i.e., source) of the driving transistor DT to decrease and thus affecting a brightness uniformity of the display apparatus.

Figure 3:
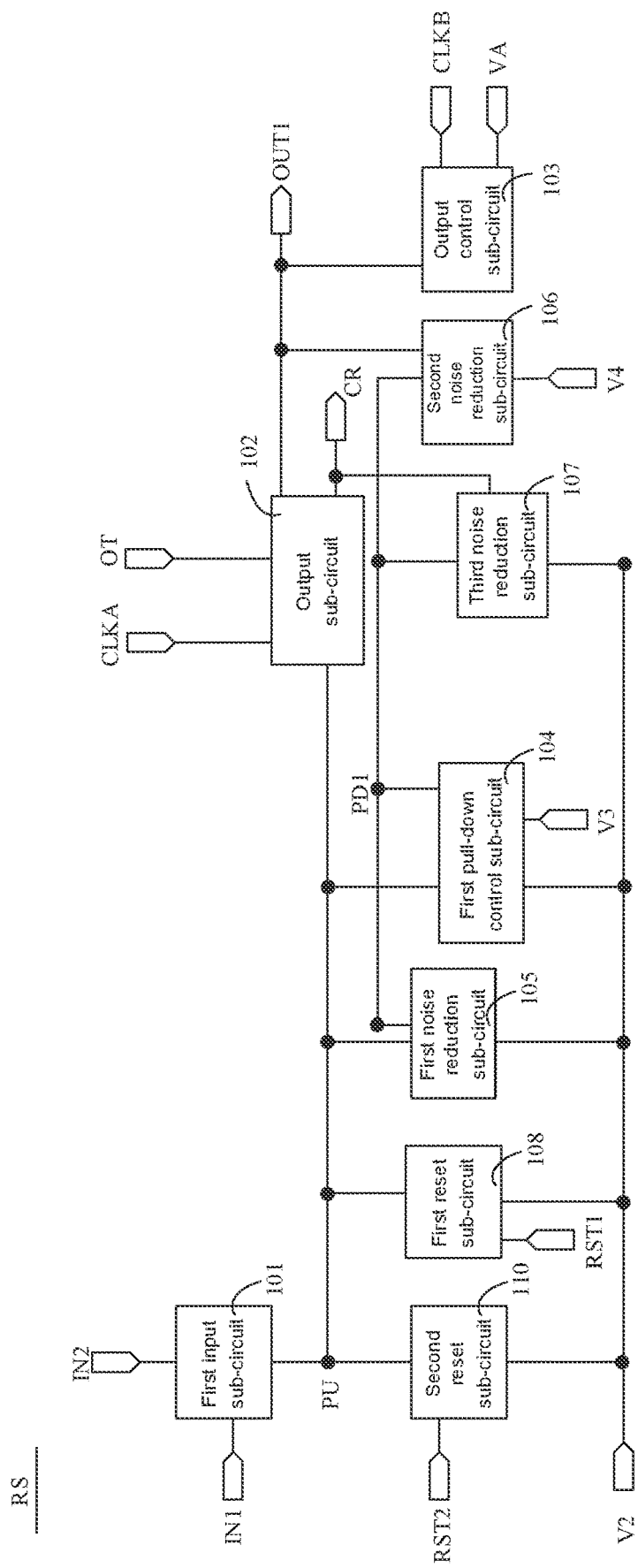
FIG. 3 is a diagram showing a structure of a shift register circuit, in accordance with some embodiments.

The embodiments of the present disclosure provide a shift register circuit RS. As shown in FIG. 3, the shift register circuit includes a first input sub-circuit 101, an output sub-circuit 102 and an output control sub-circuit 103.

The first input sub-circuit 101 is coupled to a first signal input terminal IN1, a second signal input terminal IN2 and a pull-up node PU.

The output sub-circuit 102 is at least coupled to the pull-up node PU, a first clock signal terminal CLKA, an output signal transmission terminal OT, a shift signal output terminal CR and a first scan signal output terminal OUT1.

The output control sub-circuit 103 is coupled to a second clock signal terminal CLKB, a chamfering signal terminal VA and the first scan signal output terminal OUT1.

The first input sub-circuit 101 is configured to transmit a signal received at the second signal input terminal IN2 to the pull-up node PU under the control of a signal received at the first signal input terminal IN1.

It will be noted that, the signal received at the second signal input terminal IN2 may be a fixed-level signal, for example, a direct current (DC) high-level signal. In this case, the second signal input terminal IN2 may serve as a fixed voltage terminal. For example, the fixed voltage terminal transmits the DC high-level signal. Or, the signal received at the second signal input terminal IN2 is the same as the signal received at the first signal input terminal IN1, that is, the second signal input terminal IN2 and the first signal input terminal IN1 are the same signal terminal.

The output sub-circuit 102 is configured to transmit a signal received at the first clock signal terminal CLKA to the shift signal output terminal CR and to transmit a signal received at the output signal transmission terminal OT to the first scan signal output terminal OUT1 in response to a voltage of the pull-up node PU, so as to scan a gate line coupled to the first scan signal output terminal OUT1.

It will be noted that, the signal received at the output signal transmission terminal OT may be a clock signal. For example, the signal received at the output signal transmission terminal OT is the same as the signal received at the first clock signal terminal CLKA. Or, the signal received at the output signal transmission terminal OT may be a fixed-level signal, for example, a DC level signal.

The output control sub-circuit 103 is configured to transmit a signal received at the chamfering signal terminal VA to the first scan signal output terminal OUT1 in response to a signal received at the second clock signal terminal CLKB in a predetermined time before the first scan signal output terminal OUT1 stops outputting a signal from the output signal transmission terminal OT.

The chamfering signal terminal VA is configured to transmit a signal with a voltage amplitude within a variation range of a voltage amplitude of a signal of the first scan signal output terminal OUT1.

It will be understood that, in a period of time before the first scan signal output terminal OUT1 stops outputting a valid signal, the output control sub-circuit 103 transmits the signal received at the chamfering signal terminal VA to the first scan signal output terminal OUT1. After this period of time, signal output from the first scan signal output terminal OUT1 is an invalid signal. This period of time is the predetermined time.

A duration of the predetermined time before the first scan signal output terminal OUT1 stops outputting the signal from the output signal transmission terminal OT is a duration in which the output control sub-circuit 103 transmits the signal received at the chamfering signal terminal VA to the first scan signal output terminal OUT1.

It will be noted that, the signal received at the chamfering signal terminal VA may be a fixed-level signal, for example, a DC low-level signal. In this case, the chamfering signal terminal VA may serve as a fixed voltage terminal, and the voltage amplitude of the fixed voltage terminal is within the variation range of the voltage amplitude of the signal of the first scan signal output terminal OUT1. Or, the signal received at the chamfering signal terminal VA may be a signal with a variable voltage amplitude. In this case, the chamfering signal terminal VA may serve as a variable voltage terminal, and a variation range of the voltage amplitude of the variable voltage terminal is within the variation range of the voltage amplitude of the signal of the first scan signal output terminal OUT1.

In this case, the output sub-circuit 102 transmits the signal received at the output signal transmission terminal OT to the first scan signal output terminal OUT1, so that a voltage of the signal output from the first scan signal output terminal OUT1 is equal to a voltage of the signal received at the output signal transmission terminal OT. In the predetermined time before the first scan signal output terminal OUT1 stops outputting the signal from the output signal transmission terminal OT, the output control sub-circuit 103 transmits the signal received at the chamfering signal terminal VA to the first scan signal output terminal OUT1. Moreover, the voltage amplitude of the signal received at the chamfering signal terminal VA is within the variation range of the voltage amplitude of the signal of the first scan signal output terminal OUT1. That is, the voltage amplitude of the signal received at the chamfering signal terminal VA is less than the voltage amplitude of the signal output from the first scan signal output terminal OUT1. Therefore, a potential of the signal output from the first scan signal output terminal OUT1 is affected by the signal received at the chamfering signal terminal VA and decreases, so that during a process in which a potential of the signal output from the first scan signal output terminal OUT1 changes, for example, from a high-level signal to a low-level signal, a change gradient is reduced, and a change time increases. In this way, it may be possible to avoid a problem that an afterimage appears on the display apparatus due to flickering of the light-emitting device, and thus improve a display effect.

It will be noted that, the duration of the predetermined time before the first scan signal output terminal OUT1 stops outputting the signal from the output signal transmission terminal OT and a potential of the signal received at the chamfering signal terminal VA may be set according to actual situations, so as to adjust a curvature, voltage and amplitude of a chamfered portion of a waveform of the signal output from the first scan signal output terminal OUT1, which is not limited herein.

Therefore, the shift register circuit RS provided in the embodiments of the present disclosure includes the first input sub-circuit 101, the output sub-circuit 102 and the output control sub-circuit 103. The first input sub-circuit 101 transmits the signal received at the second signal input terminal IN2 to the pull-up node PU under the control of the signal received at the first signal input terminal IN1. The output sub-circuit 102 transmits the signal received at the first clock signal terminal CLKA to the shift signal output terminal CR, and transmits the signal received at the output signal transmission terminal OT to the first scan signal output terminal OUT1 in response to the voltage of the pull-up node PU. The output control sub-circuit 103 transmits the signal received at the chamfering signal terminal VA to the first scan signal output terminal OUT1 in response to the signal received at the second clock signal terminal CLKB in the predetermined time before the first scan signal output terminal OUT1 stops outputting the signal from the output signal transmission terminal OT. The chamfering signal terminal VA is configured to transmit the signal with the voltage amplitude within the variation range of the voltage amplitude of the signal of the first scan signal output terminal OUT1. In this way, in a process when the first scan signal output terminal OUT1 outputs the signal normally, the potential of the signal output from the first scan signal output terminal OUT1 is affected by the signal received at the chamfering signal terminal VA and decreases, so that during the process in which the potential of the signal output from the first scan signal output terminal OUT1 changes, for example, from the high-level signal to the low-level signal, the change gradient is reduced, and the change time increases. In addition, a resistance and a parasitic capacitance of the first scan signal line G1 also reduce the potential of the signal output from the first scan signal output terminal OUT1, so that a chamfering effect (e.g., an arc-shaped chamfering effect) appears on the waveform of the signal output from the first scan signal output terminal OUT1 in the predetermined time before the first scan signal output terminal OUT1 stops outputting the signal from the output signal transmission terminal OT, and the change gradient of the potential of the signal output from the first scan signal output terminal OUT1 is reduced. In this way, it may be possible to avoid the problem that the afterimage appears on the display apparatus due to the flickering of the light-emitting device, and thus improve the display effect.

Figure 4:
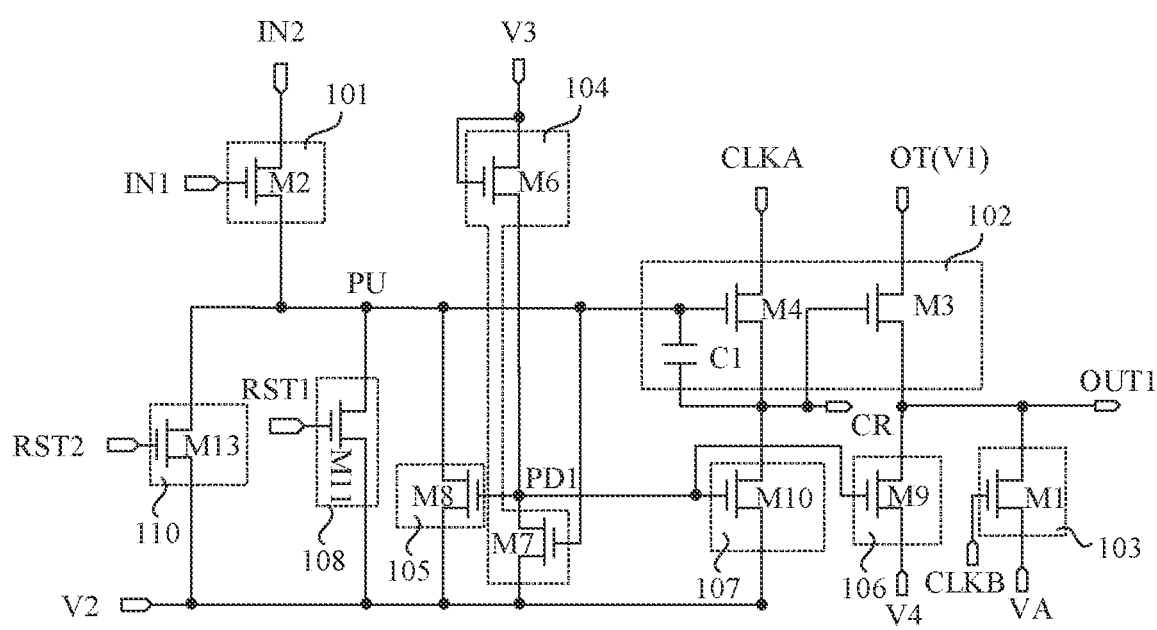
FIG. 4 is a diagram showing a structure of another shift register circuit, in accordance with some embodiments.

For example, as shown in FIG. 4, the output control sub-circuit 103 includes a first transistor M1.

A control electrode of the first transistor M1 is coupled to the second clock signal terminal CLKB, a first electrode of the first transistor M1 is coupled to the chamfering signal terminal VA, and a second electrode of the first transistor M1 is coupled to the first scan signal output terminal OUT1.

For example, as shown in FIG. 4, the first input sub-circuit 101 includes a second transistor M2.

A control electrode of the second transistor M2 is coupled to the first signal input terminal IN1, a first electrode of the second transistor M2 is coupled to the second signal input terminal IN2, and a second electrode of the second transistor M2 is coupled to the pull-up node PU.

For example, as shown in FIG. 4, the output sub-circuit 102 includes a third transistor M3 and a fourth transistor M4.

A control electrode of the third transistor M3 is coupled to the pull-up node PU or the shift signal output terminal CR, a first electrode of the third transistor M3 is coupled to the output signal transmission terminal OT, and a second electrode of the third transistor M3 is coupled to the first scan signal output terminal OUT1.

It will be noted that, in a case where the output control sub-circuit 103 includes the first transistor M1, a width-to-length ratio of a channel of the first transistor M1 is less than a width-to-length ratio of a channel of the third transistor M3.

A control electrode of the fourth transistor M4 is coupled to the pull-up node PU, a first electrode of the fourth transistor M4 is coupled to the first clock signal terminal CLKA, and a second electrode of the fourth transistor M4 is coupled to the shift signal output terminal CR.

Figure 5:
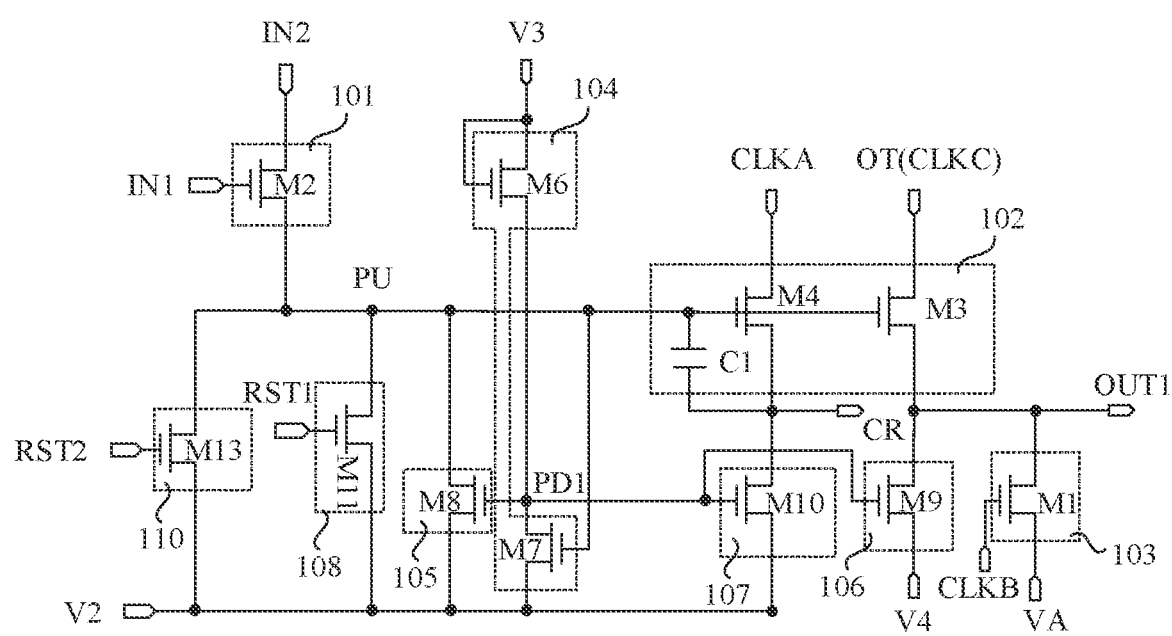
FIG. 5 is a diagram showing a structure of yet another shift register circuit, in accordance with some embodiments.

As shown in FIG. 5, in a case where the control electrode of the third transistor M3 is coupled to the pull-up node PU, the output signal transmission terminal OT is a third clock signal terminal CLKC. As shown in FIG. 4, in a case where the control electrode of the third transistor M3 is coupled to the shift signal output terminal CR, the output signal transmission terminal OT is a first voltage terminal V1.

It will be understood that, in a case where the output signal transmission terminal OT is the third clock signal terminal CLKC, the signal received at the output signal transmission terminal OT is a clock signal; in a case where the output signal transmission terminal OT is the first voltage terminal V1, the signal received at the output signal transmission terminal OT is a fixed-level signal, for example, a DC high-level signal.

For example, the output control sub-circuit 102 further includes a first capacitor C1. As shown in FIG. 5, a first terminal of the first capacitor C1 is coupled to the pull-up node PU and the control electrode of the fourth transistor M4, and a second terminal of the first capacitor C1 is coupled to the shift signal output terminal CR and the second electrode of the fourth transistor M4.

As shown in FIG. 4, in the case where the control electrode of the third transistor M3 is coupled to the shift signal output terminal CR, the first terminal of the first capacitor C1 is coupled to the pull-up node PU and the control electrode of the fourth transistor M4, and the second terminal of the first capacitor C1 is coupled to the shift signal output terminal CR, the control electrode of the third transistor M3 and the second electrode of the fourth transistor M4.

Figure 20:
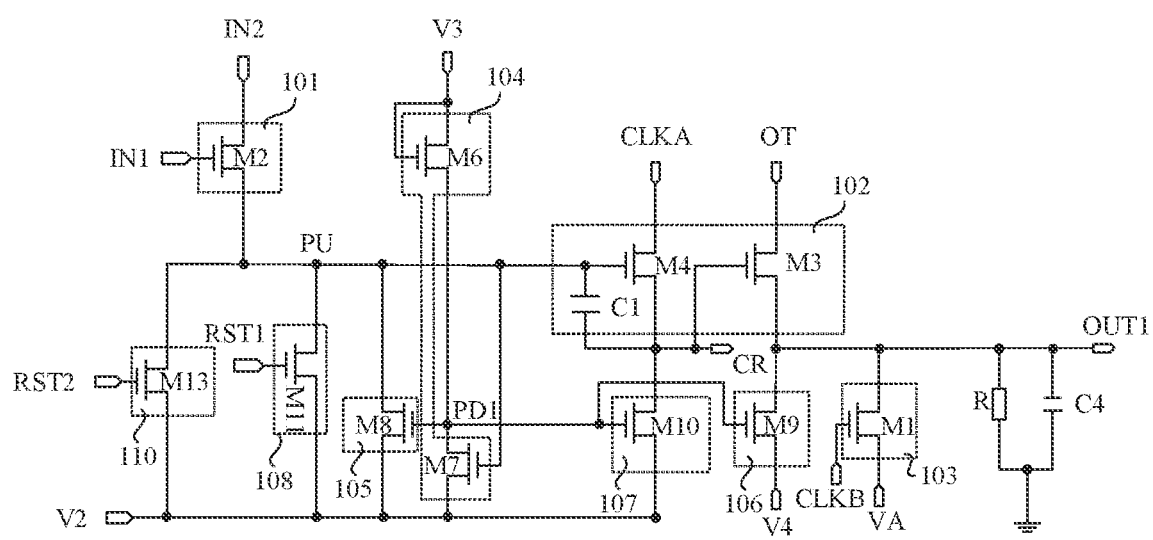
FIG. 20 is a diagram showing a structure of yet another shift register circuit, in accordance with some embodiments.

In some embodiments, as shown in FIG. 20, the shift register circuit RS further includes a resistor R and a fourth capacitor C4.

A first terminal of the resistor R is coupled to the first scan signal output terminal OUT1, and a second terminal of the resistor R is grounded.

A first terminal of the fourth capacitor C4 is coupled to the first scan signal output terminal OUT1, and a second terminal of the fourth capacitor C4 is grounded.

In this case, in the predetermined time before the first scan signal output terminal OUT1 stops outputting the signal from the output signal transmission terminal OT, the potential of the signal output from the first scan signal output terminal OUT1 is affected by the resistor R and the fourth capacitor C4 and decreases, so that the chamfering effect appears on the waveform of the signal output from the first scan signal output terminal OUT1.

Figure 6:
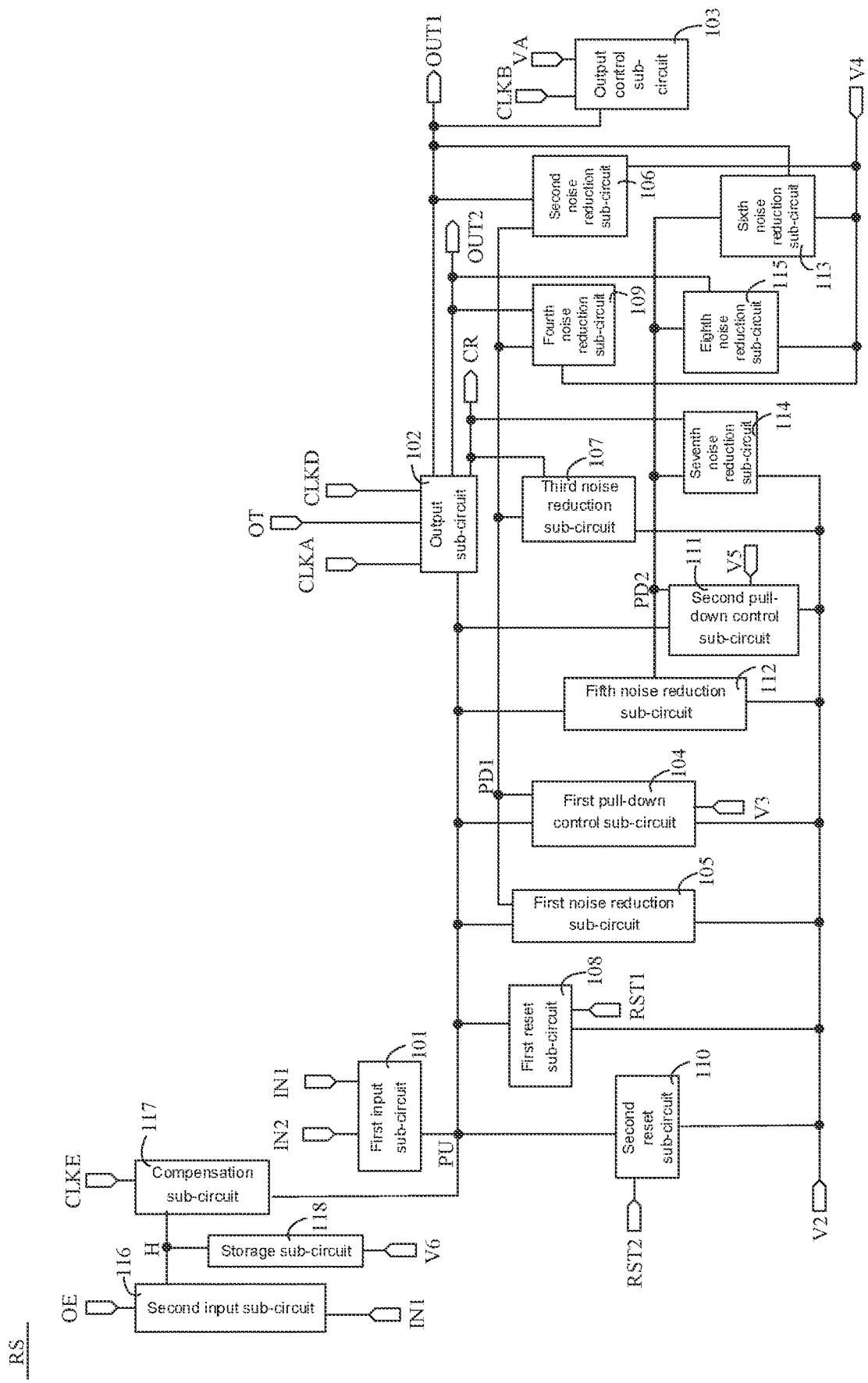
FIG. 6 is a diagram showing a structure of yet another shift register circuit, in accordance with some embodiments.

In some embodiments, as shown in FIG. 6, the output sub-circuit 102 is further coupled to a fourth clock signal terminal CLKD and a second scan signal output terminal OUT2.

The output sub-circuit 102 is configured to transmit a signal received at the fourth clock signal terminal CLKD to the second scan signal output terminal OUT2 in response to the voltage of the pull-up node PU.

Figure 7:
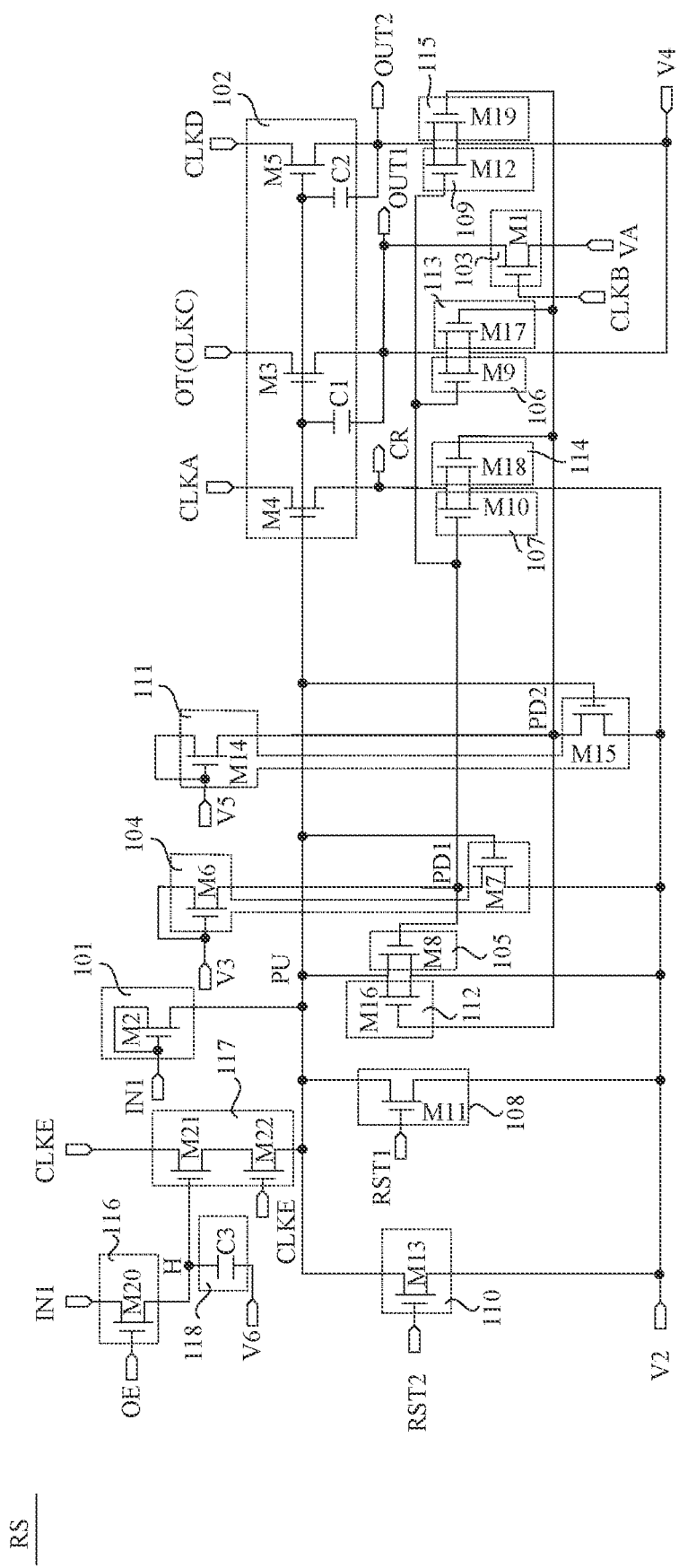
FIG. 7 is a diagram showing a structure of yet another shift register circuit, in accordance with some embodiments.

For example, as shown in FIG. 7, the output sub-circuit 102 further includes a fifth transistor M5 and a second capacitor C2.

A control electrode of the fifth transistor M5 is coupled to the pull-up node, a first electrode of the fifth transistor M5 is coupled to the fourth clock signal terminal CLKD, and a second electrode of the fifth transistor M5 is coupled to the second scan signal output terminal OUT2.

A first terminal of the second capacitor C2 is coupled to the pull-up PU node and the control electrode of the fifth transistor M5, and a second terminal of the second capacitor C2 is coupled to the second scan signal output terminal OUT2 and the second electrode of the fifth transistor M5.

For example, in a case where the output sub-circuit 102 includes the first capacitor C1, and the control electrode of the third transistor M3 is coupled to the pull-up node PU, as shown in FIG. 7, the first terminal of the first capacitor C1 is coupled to the pull-up node PU and the control electrode of the third transistor M3, and the second terminal of the first capacitor C1 is coupled to the first scan signal output terminal OUT1 and the second electrode of the third transistor M3.

For example, in a case where the second signal input terminal IN2 and the first signal input terminal IN1 are the same signal terminal, and further in a case where the first input sub-circuit 101 includes the second transistor M2, as shown in FIG. 7, the first electrode of the second transistor M2 is coupled to the first signal input terminal IN1.

In some embodiments, as shown in FIGS. 3 and 6, the shift register circuit RS further includes a first pull-down control sub-circuit 104.

The first pull-down control sub-circuit 104 is coupled to the pull-up node PU, a first pull-down node PD1, a second voltage terminal V2 and a third voltage terminal V3.

The first pull-down control sub-circuit 104 is configured to transmit a voltage of the second voltage terminal V2 to the first pull-down node PD1 under the control of the voltage of the pull-up node PU, and to transmit a voltage of the third voltage terminal V3 to the first pull-down node PD1 under the control of the voltage of the third voltage terminal V3.

The third voltage terminal V3 is configured to transmit a fixed-level signal, such as a DC high-level voltage, during an operation period of the first pull-down control sub-circuit 104. The second voltage terminal V2 is configured to transmit a fixed-level signal, such as a DC low-level voltage.

Figure 8:
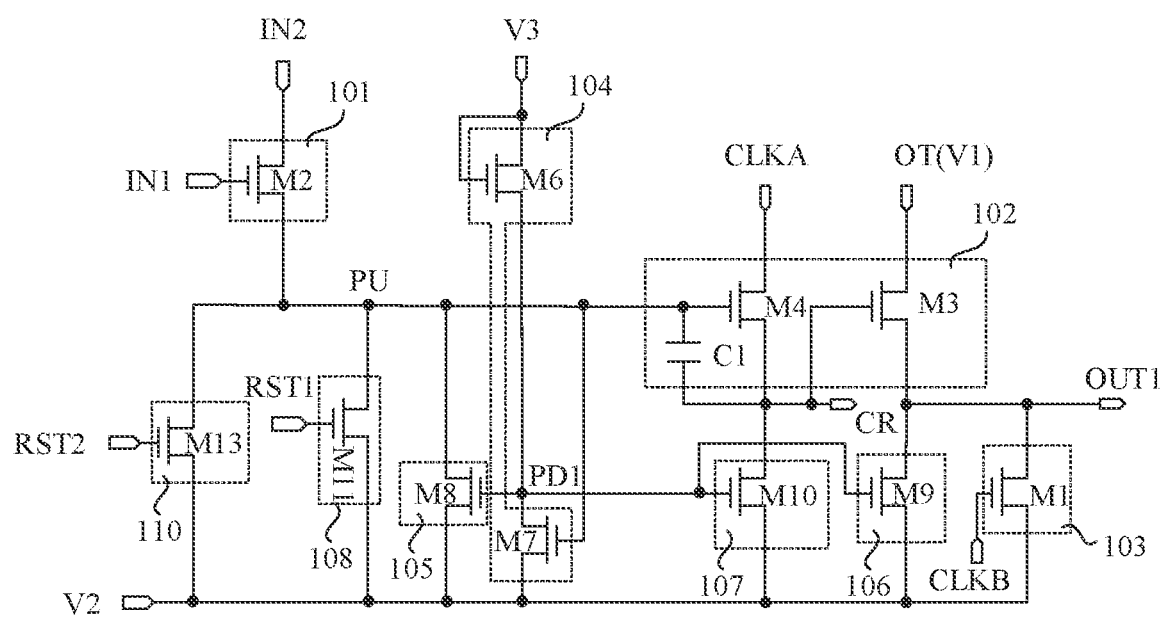
FIG. 8 is a diagram showing a structure of yet another shift register circuit, in accordance with some embodiments.
Figure 9:
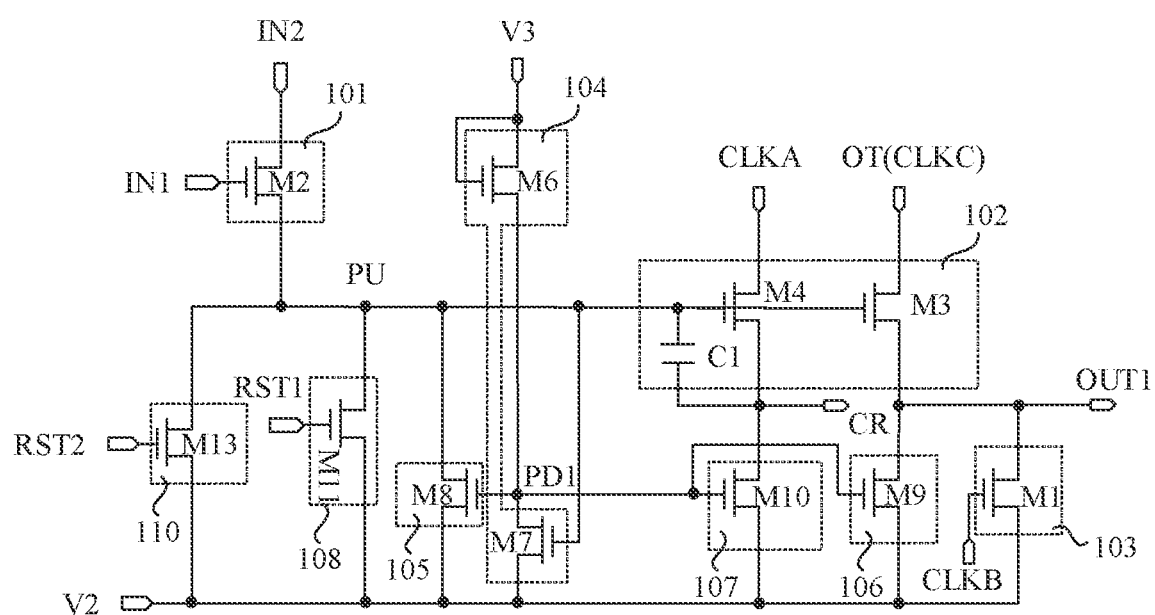
FIG. 9 is a diagram showing a structure of yet another shift register circuit, in accordance with some embodiments.

For example, in the case where the output signal transmission terminal OT is the first voltage terminal V1, the first voltage terminal V1 and the second voltage terminal V2 are the same voltage terminal. In this case, in the case where the output control sub-circuit 103 includes the first transistor M1, as shown in FIGS. 8 and 9, the first electrode of the first transistor M1 is coupled to the second voltage terminal V2.

For example, as shown in FIGS. 4 and 7, the first pull-down control sub-circuit 104 includes a sixth transistor M6 and a seventh transistor M7.

A control electrode and a first electrode of the sixth electrode M6 are coupled to the third voltage terminal V3, and a second electrode of the sixth transistor M6 is coupled to the first pull-down node PD1.

A control electrode of the seventh transistor M7 is coupled to the pull-up node PU, a first electrode of the seventh transistor is coupled to the second voltage terminal V2, and a second electrode of the seventh transistor M7 is coupled to the first pull-down node PD1.

In some embodiments, as shown in FIGS. 3 and 6, the shift register circuit RS further includes a first noise reduction sub-circuit 105.

The first noise reduction sub-circuit 105 is coupled to the pull-up node PU, the first pull-down node PD1 and the second voltage terminal V2.

The first noise reduction sub-circuit 105 is configured to transmit the voltage of the second voltage terminal V2 to the pull-up node PU under the control of a voltage of the first pull-down node PD1, so as to denoise the pull-up node PU in a stage when the shift register circuit RS does not output a scan signal.

For example, as shown in FIGS. 4 and 7, the first noise reduction sub-circuit 105 includes an eighth transistor M8.

A control electrode of the eighth transistor M8 is coupled to the first pull-down node PD1, a first electrode of the eighth transistor M8 is coupled to the second voltage terminal V2, and a second electrode of the eighth transistor M8 is coupled to the pull-up node PU.

In some embodiments, as shown in FIGS. 3 to 6, the shift register circuit RS further includes a second noise reduction sub-circuit 106.

The second noise reduction sub-circuit 106 is coupled to the first scan signal output terminal OUT1, the first pull-down node PD1 and a fourth voltage terminal V4.

The second noise reduction sub-circuit 106 is configured to transmit a voltage of the fourth voltage terminal V4 to the first scan signal output terminal OUT1 under the control of the voltage of the first pull-down node PD1, so as to denoise the first scan signal output terminal OUT1 in the stage when the shift register circuit RS does not output the scan signal.

The fourth voltage terminal V4 is configured to transmit a DC low-level signal.

For example, the fourth voltage terminal V4 and the second voltage terminal V2 may be the same voltage terminal, or may be different voltage terminals.

For example, as shown in FIGS. 4 and 7, the second noise reduction sub-circuit 106 includes a ninth transistor M9.

A control electrode of the ninth transistor M9 is coupled to the first pull-down node PD1, a first electrode of the ninth transistor M9 is coupled to the fourth voltage terminal V4, and a second electrode of the ninth transistor M9 is coupled to the first scan signal output terminal OUT1.

For example, in a case where the fourth voltage terminal V4 and the second voltage terminal V2 are the same voltage terminal, as shown in FIG. 8, the first electrode of the ninth transistor M9 is coupled to the second voltage terminal V2.

Figure 10:
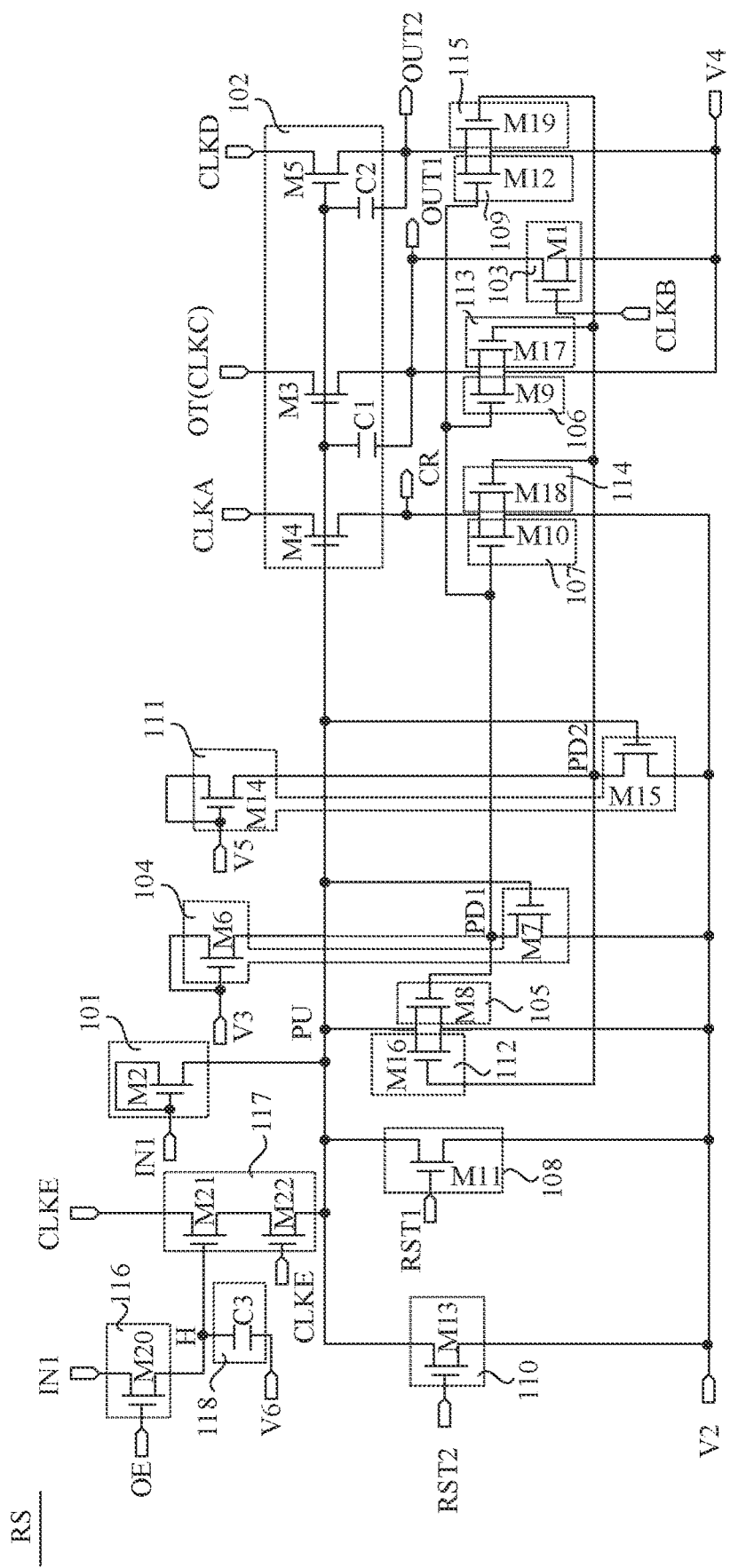
FIG. 10 is a diagram showing a structure of yet another shift register circuit, in accordance with some embodiments.

For example, in the case where the fourth voltage terminal V4 and the second voltage terminal V2 are the same voltage terminal, the output signal transmission terminal OT is the first voltage terminal V1, and the first voltage terminal V1 and the second voltage terminal V2 are the same voltage terminal, and further in the case where the output control sub-circuit 103 includes the first transistor M1, as shown in FIG. 10, the first electrode of the first transistor M1 is coupled to the fourth voltage terminal V4.

In some embodiments, as shown in FIGS. 3 to 6, the shift register circuit further includes a third noise reduction sub-circuit 107.

The third noise reduction sub-circuit 107 is coupled to the shift signal output terminal CR, the first pull-down node PD1 and the second voltage terminal V2.

The third noise reduction sub-circuit 107 is configured to transmit the voltage at the second voltage terminal V2 to the shift signal output terminal CR under the control of the voltage of the first pull-down node PD1, so as to denoise the shift signal output terminal CR in the stage when the shift register circuit RS does not output the scan signal.

For example, as shown in FIGS. 4 and 7, the third noise reduction sub-circuit 107 includes a tenth transistor M10.

A control electrode of the tenth transistor M10 is coupled to the first pull-down node PD1, a first electrode of the tenth transistor M10 is coupled to the second voltage terminal V2, and a second electrode of the tenth transistor M10 is coupled to the shift signal output terminal CR.

In some embodiments, as shown in FIGS. 3 and 6, the shift register circuit RS further includes a first reset sub-circuit 108.

The first reset sub-circuit 108 is coupled to the pull-up node PU, a first reset signal terminal RST1 and the second voltage terminal V2.

The first reset sub-circuit 108 is configured to transmit the voltage of the second voltage terminal V2 to the pull-up node PU under the control of a signal received at the first reset signal terminal RST1.

For example, as shown in FIGS. 4 and 7, the first reset sub-circuit 108 includes an eleventh transistor M11.

A control electrode of the eleventh transistor M11 is coupled to the first reset signal terminal RST1, a first electrode of the eleventh transistor M11 is coupled to the second voltage terminal V2, and a second electrode of the eleventh transistor M11 is coupled to the pull-up node PU.

In some embodiments, as shown in FIG. 6, in a case where the output sub-circuit 102 is further coupled to the second scan signal output terminal OUT2, the shift register circuit RS further includes a fourth noise reduction sub-circuit 109.

The fourth noise reduction sub-circuit 109 is coupled to the second scan signal output terminal OUT2, the first pull-down node PD1 and the fourth voltage terminal V4.

The fourth noise reduction sub-circuit 109 is configured to transmit the voltage of the fourth voltage terminal V4 to the second scan signal output terminal OUT2 under the control of the voltage of the first pull-down node PD1, so as to denoise the second scan signal output terminal OUT2 in the stage when the shift register circuit RS does not output the scan signal.

For example, as shown in FIG. 7, the fourth noise reduction sub-circuit 109 includes a twelfth transistor M12.

A control electrode of the twelfth transistor M12 is coupled to the first pull-down node PD1, a first electrode of the twelfth transistor M12 is coupled to the fourth voltage terminal V4, and a second electrode of the twelfth transistor M12 is coupled to the second scan signal output terminal OUT2.

In some embodiments, as shown in FIGS. 3 and 6, the shift register circuit RS further includes a second rest sub-circuit 110.

The second reset sub-circuit 110 is coupled to a second reset signal terminal RST2, the pull-up node PU and the second voltage terminal V2.

The second reset sub-circuit 110 is configured to transmit the voltage of the second voltage terminal V2 to the pull-up node PU under the control of a signal received at the second reset signal terminal RST2.

For example, as shown in FIGS. 4 and 7, the second reset sub-circuit 110 includes a thirteenth transistor M13.

A control electrode of the thirteenth transistor M13 is coupled to the second reset signal terminal RST2, a first electrode of the thirteenth transistor M13 is coupled to the second voltage terminal V2, and a second electrode of the thirteenth transistor M13 is coupled to the pull-up node PU.

In some embodiments, as shown in FIG. 6, the shift register circuit RS further includes a second pull-down control sub-circuit 111.

The second pull-down control sub-circuit 111 is coupled to the pull-up node PU, a second pull-down node PD2, the second voltage terminal V2 and a fifth voltage terminal V5.

The second pull-down control sub-circuit 111 is configured to transmit the voltage of the second voltage terminal V2 to the second pull-down node PD2 under the control of the voltage of the pull-up node PU, and to transmit a voltage of the fifth voltage terminal V5 to the second pull-down node PD2 under the control of the voltage of the fifth voltage terminal V5.

The fifth voltage terminal V5 is configured to transmit a fixed-level voltage, such as a DC high-level voltage, during an operation period of the second pull-down control sub-circuit 111.

In some embodiments, the first pull-down control sub-circuit 104 and the second pull-down control sub-circuit 111 operate alternately. In this way, continuous operation of the first pull-down control sub-circuit 104 or the second pull-down control sub-circuit 111 is avoided, thereby shortening respective operation times of the first pull-down control sub-circuit 104 and the second pull-down control sub-circuit 111, and prolonging a service life of the shift register circuit RS.

It will be noted that, a cycle of an alternate operation of the first pull-down control sub-circuit 104 and the second pull-down control sub-circuit 111 is not limited in the present disclosure and may be set according to actual situations.

For example, as shown in FIG. 7, the second pull-down control sub-circuit 111 includes a fourteenth transistor M14 and a fifteenth transistor M15.

A control electrode and a first electrode of the fourteenth transistor M14 are coupled to the fifth voltage terminal V5, and a second electrode of the fourteenth transistor M14 is coupled to the second pull-down node PD2.

A control electrode of the fifteenth transistor M15 is coupled to the pull-up node PU, a first electrode of the fifteenth transistor M15 is coupled to the second voltage terminal V2, and a second electrode of the fifteenth transistor M15 is coupled to the second pull-down node PD2.

In some embodiments, as shown in FIG. 6, the shift register circuit RS further includes a fifth noise reduction sub-circuit 112.

The fifth noise reduction sub-circuit 112 is coupled to the pull-up node PU, the second pull-down node PD2 and the second voltage terminal V2.

The fifth noise reduction sub-circuit 112 is configured to transmit the voltage of the second voltage terminal V2 to the pull-up node PU under the control of the voltage of the second pull-down node PD2, so as to denoise the pull-up node PU in the stage when the shift register circuit RS does not output the scan signal.

For example, as shown in FIG. 7, the fifth noise reduction sub-circuit 112 includes a sixteenth transistor M16.

A control electrode of the sixteenth transistor M16 is coupled to the second pull-down node PD2, a first electrode of the sixteenth transistor M16 is coupled to the second voltage terminal V2, and a second electrode of the sixteenth transistor M16 is coupled to the pull-up node PU.

In some embodiments, as shown in FIG. 6, the shift register circuit RS further includes a sixth noise reduction sub-circuit 113.

The sixth noise reduction sub-circuit 113 is coupled to the first scan signal output terminal OUT1, the second pull-down node PD2 and the fourth voltage terminal V4.

The sixth noise reduction sub-circuit 113 is configured to transmit the voltage of the fourth voltage terminal V4 to the first scan signal output terminal OUT1 under the control of the voltage of the second pull-down node PD2, so as to denoise the first scan signal output terminal OUT1 in the stage when the shift register circuit RS does not output the scan signal.

For example, as shown in FIG. 7, the sixth noise reduction sub-circuit 113 includes a seventeenth transistor M17.

A control electrode of the seventeenth transistor M17 is coupled to the second pull-down node PD2, a first electrode of the seventeenth transistor M17 is coupled to the fourth voltage terminal V4, and a second electrode of the seventeenth transistor M17 is coupled to the first scan signal output terminal OUT1.

In some embodiments, as shown in FIG. 6, the shift register circuit RS further includes a seventh noise reduction sub-circuit 114.

The seventh noise reduction sub-circuit 114 is coupled to the shift signal output terminal CR, the second pull-down node PD2 and the second voltage terminal V2.

The seventh noise reduction sub-circuit 114 is configured to transmit the voltage of the second voltage terminal V2 to the shift signal output terminal CR under the control of the voltage of the second pull-down node PD2, so as to denoise the shift signal output terminal CR in the stage when the shift register circuit RS does not output the scan signal.

For example, as shown in FIG. 7, the seventh noise reduction sub-circuit 114 includes an eighteenth transistor M18.

A control electrode of the eighteenth transistor M18 is coupled to the second pull-down node PD2, a first electrode of the eighteenth transistor M18 is coupled to the second voltage terminal V2, and a second electrode of the eighteenth transistor M18 is coupled to the shift signal output terminal CR.

In some embodiments, as shown in FIG. 6, in the case where the output sub-circuit 102 is further coupled to the second scan signal output terminal OUT2, the shift register circuit RS further includes an eighth noise reduction sub-circuit 115.

The eighth noise reduction sub-circuit 115 is coupled to the second scan signal output terminal OUT2, the second pull-down node PD2 and the fourth voltage terminal V4.

The eighth noise reduction sub-circuit 115 is configured to transmit the voltage of the fourth voltage terminal V4 to the second scan signal output terminal OUT2 under the control of the voltage of the second pull-down node PD2, so as to denoise the second scan signal output terminal OUT2 in the stage when the shift register circuit RS does not output the scan signal.

For example, as shown in FIG. 7, the eighth noise reduction sub-circuit 115 includes a nineteenth transistor M19.

A control electrode of the nineteenth transistor M19 is coupled to the second pull-down node PD2, a first electrode of the nineteenth transistor M19 is coupled to the fourth voltage terminal V4, and a second electrode of the nineteenth transistor M19 is coupled to the second scan signal output terminal OUT2.

In some embodiments, as shown in FIG. 6, the shift register circuit RS further includes a second input sub-circuit 116, a compensation sub-circuit 117 and a storage sub-circuit 118.

The second input sub-circuit 116 is coupled to a control signal terminal OE, the first signal input terminal IN1 and a first node H.

The compensation sub-circuit 117 is coupled to a fifth clock signal terminal CLKE, the first node H and the pull-up node PU.

The storage sub-circuit 118 is coupled to a sixth voltage terminal V6 and the first node H.

The second input sub-circuit 116 is configured to transmit the signal received at the first signal input terminal IN1 to the first node H under the control of a signal received at the control signal terminal OE.

The compensation sub-circuit 117 is configured to transmit a signal received at the fifth clock signal terminal CLKE to the pull-up node PU under the control of a voltage of the first node H and a signal received at the fifth clock signal terminal CLKE.

The storage sub-circuit 118 is configured to store a signal that is transmitted to the first node H from the first signal input terminal IN1.

It will be noted that, the sixth voltage terminal V6 is configured to transmit a fixed-level signal, for example, a DC high-level signal or a DC low-level signal.

For example, as shown in FIG. 7, the second input sub-circuit 116 includes a twentieth transistor M20.

A control electrode of the twentieth transistor M20 is coupled to the control signal terminal OE, a first electrode of the twentieth transistor M20 is coupled to the first signal input terminal IN1, and a second electrode of the twentieth transistor M20 is coupled to the first node H.

For example, as shown in FIG. 7, the compensation sub-circuit 117 includes a twenty-first transistor M21 and a twenty-second transistor M22.

A control electrode of the twenty-first transistor M21 is coupled to the first node H, and a first electrode of the twenty-first transistor M21 is coupled to the fifth clock signal terminal CLKE.

A control electrode of the twenty-second transistor M22 is coupled to the fifth clock signal terminal CLKE, a first electrode of the twenty-second transistor M22 is coupled to a second electrode of the twenty-first transistor M21, and a second electrode of the twenty-second transistor M22 is coupled to the pull-up node PU.

For example, as shown in FIG. 7, the storage sub-circuit 118 includes a third capacitor C3.

A first terminal of the third capacitor C3 is coupled to the sixth voltage terminal V6, and a second terminal of the third capacitor C3 is coupled to the first node H.

Figure 11:
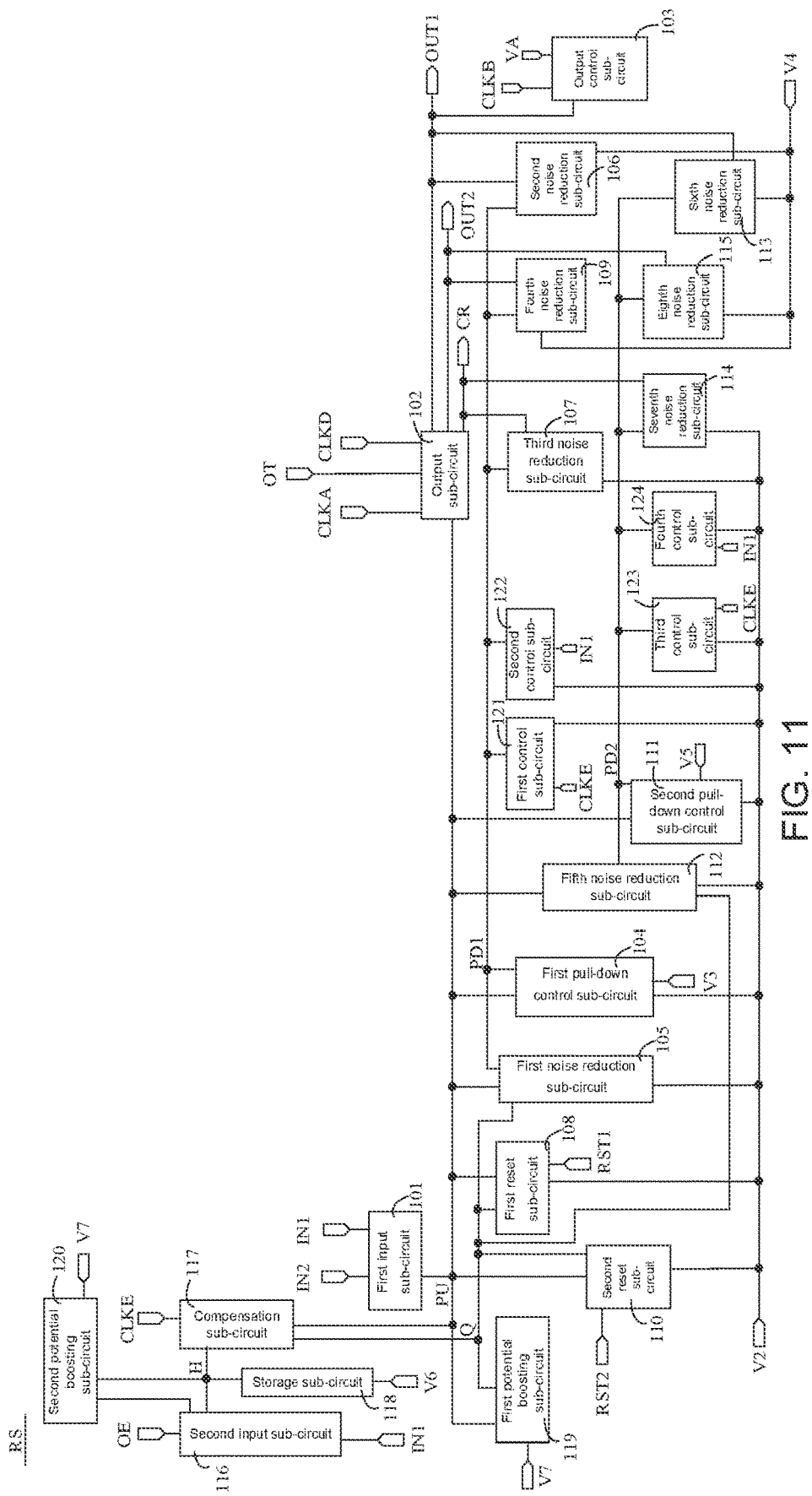
FIG. 11 is a diagram showing a structure of yet another shift register circuit, in accordance with some embodiments.

In some embodiments, as shown in FIG. 11, the shift register circuit RS further includes a first potential boosting sub-circuit 119 and a second potential boosting sub-circuit 120.

The first potential boosting sub-circuit 119 is coupled to a seventh voltage terminal V7, the pull-up node PU and a second node Q. The second node Q is coupled to the compensation sub-circuit 117.

The second potential boosting sub-circuit 120 is coupled to the seventh voltage terminal V7, the first node H and the second input sub-circuit 116.

The first potential boosting sub-circuit 119 is configured to transmit a voltage of the seventh voltage terminal V7 to the second node Q under the control of the voltage of the pull-up node PU, so as to reduce leakage currents of the transistors in the compensation sub-circuit 117 that is coupled to the second node Q.

The second potential boosting sub-circuit 120 is configured to transmit the voltage of the seventh voltage terminal V7 to the second input sub-circuit 116 under the control of the voltage of the first node H, so as to reduce a leakage current of the transistor in the second input sub-circuit 116.

It will be noted that, the seventh voltage terminal V7 is configured to transmit a fixed-level signal, for example, a DC high-level signal.

Figure 12:
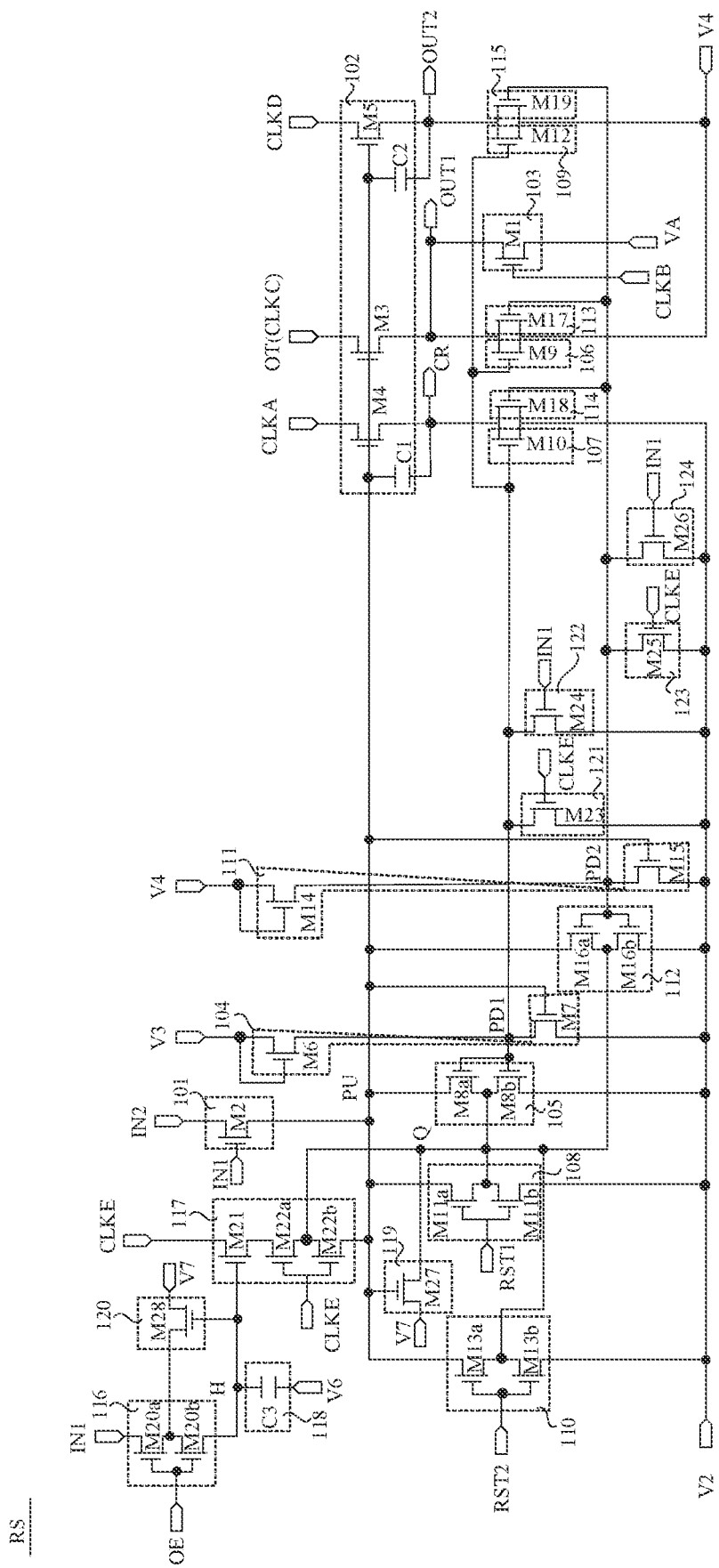
FIG. 12 is a diagram showing a structure of yet another shift register circuit, in accordance with some embodiments.
Figure 13:
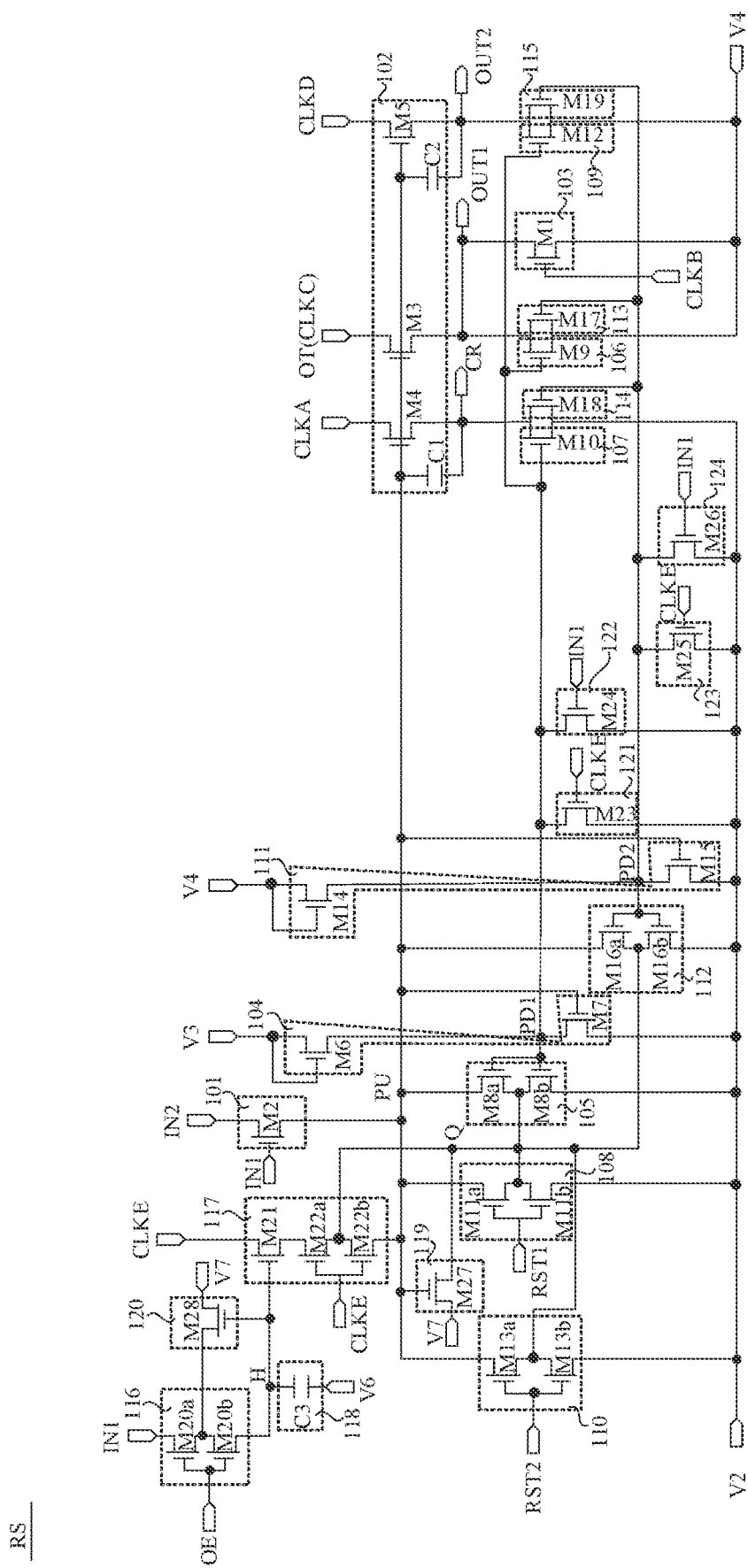
FIG. 13 is a diagram showing a structure of yet another shift register circuit, in accordance with some embodiments.

For example, as shown in FIGS. 12 and 13, the first potential boosting sub-circuit 119 includes a twenty-seventh transistor M27.

A control electrode of the twenty-seventh transistor M27 is coupled to the pull-up node PU, a first electrode of the twenty-seventh transistor M27 is coupled to the seventh voltage terminal V7, and a second electrode of the twenty-seventh transistor M27 is coupled to the second node Q.

For example, as shown in FIGS. 12 and 13, the second potential boosting sub-circuit 120 includes a twenty-eighth transistor M28.

A control electrode of the twenty-eighth transistor M28 is coupled to the first node H, a first electrode of the twenty-eighth transistor M28 is coupled to the seventh voltage terminal V7, and a second electrode of the twenty-eighth transistor M28 is coupled to the second input sub-circuit 116.

For example, as shown in FIGS. 12 and 13, the twenty-second transistor M22 in the compensation sub-circuit 117 is replaced with a transistor M22a and a transistor M22b that are connected in series. A control electrode of the transistor M22a is coupled to a control electrode of the transistor M22b and the fifth clock signal terminal CLKE, a first electrode of the transistor M22a is coupled to the twenty-first transistor M21, a second electrode of the transistor M22a is coupled to a first electrode of the transistor M22b and the second node Q, and a second electrode of the transistor M22b is coupled to the pull-up node PU.

In a case where the second potential boosting sub-circuit 120 includes the twenty-seventh transistor M27, when the twenty-seventh transistor M27 transmits the voltage of the seventh voltage terminal V7 to the second node Q under the control of the voltage of the pull-up node PU, a potential of the first electrode of the transistor M22b is the same as a potential of the second electrode of the transistor M22b, so that a leakage current of the transistor M22b is reduced.

In some embodiments, in a case where the shift register circuit RS includes the first noise reduction sub-circuit 105, the first noise reduction sub-circuit 105 is further coupled to the second node Q. For example, as shown in FIGS. 12 and 13, the eighth transistor M8 in the first noise reduction sub-circuit 105 is replaced with a transistor M8a and a transistor M8b that are connected in series. A control electrode of the transistor M8a is coupled to a control electrode of the transistor M8b and the first pull-down node PD1, a first electrode of the transistor M8a is coupled to a second electrode of the transistor M8b and the second node Q, a second electrode of the transistor M8a is coupled to the pull-up node PU, and a first electrode of the transistor M8b is coupled to the second voltage terminal V2.

In the case where the second potential boosting sub-circuit 120 includes the twenty-seventh transistor M27, when the twenty-seventh transistor M27 transmits the voltage of the seventh voltage terminal V7 to the second node Q under the control of the voltage of the pull-up node PU, a potential of the first electrode of the transistor M8a is the same as a potential of the second electrode of the transistor M8a, so that a leakage current of the transistor M8a is reduced.

In some embodiments, in a case where the shift register circuit RS includes the first reset sub-circuit 108, the first reset sub-circuit 108 is further coupled to the second node Q. For example, as shown in FIGS. 12 and 13, the eleventh transistor M11 in the first reset sub-circuit 108 is replaced with a transistor M11a and a transistor M11b that are connected in series. A control electrode of the transistor M11a is coupled to a control electrode of the transistor M11b and the first reset signal terminal RST1, a first electrode of the transistor M11a is coupled to a second electrode of the transistor M11b and the second node Q, a second electrode of the transistor M11a is coupled to the pull-up node PU, and a first electrode of the transistor M11b is coupled to the second voltage terminal V2.

In the case where the second potential boosting sub-circuit 120 includes the twenty-seventh transistor M27, when the twenty-seventh transistor M27 transmits the voltage of the seventh voltage terminal V7 to the second node Q under the control of the voltage of the pull-up node PU, a potential of the first electrode of the transistor M11a is the same as a potential of the second electrode of the transistor M11a, so that a leakage current of the transistor M11a is reduced.

In some embodiments, in a case where the shift register circuit RS includes the second reset sub-circuit 110, the second reset sub-circuit 110 is further coupled to the second node Q. For example, as shown in FIGS. 12 and 13, the thirteenth transistor M13 in the second reset sub-circuit 110 is replaced with a transistor M13a and a transistor M13b that are connected in series. A control electrode of the transistor M13a is coupled to a control electrode of the transistor M13b and the second reset signal terminal RST2, a first electrode of the transistor M13a is coupled to a second electrode of the transistor M13b and the second node Q, a second electrode of the transistor M13a is coupled to the pull-up node PU, and a first electrode of the transistor M13b is coupled to the second voltage terminal V2.

In the case where the second potential boosting sub-circuit 120 includes the twenty-seventh transistor M27, when the twenty-seventh transistor M27 transmits the voltage of the seventh voltage terminal V7 to the second node Q under the control of the voltage of the pull-up node PU, a potential of the first electrode of the transistor M13a is the same as a potential of the second electrode of the transistor M13a, so that a leakage current of the transistor M13a is reduced.

In some embodiments, in a case where the shift register circuit RS includes the fifth noise reduction sub-circuit 112, the fifth noise reduction sub-circuit 112 is further coupled to the second node Q. For example, as shown in FIGS. 12 and 13, the sixteenth transistor M16 in the fifth noise reduction sub-circuit 112 is replaced with a transistor M16a and a transistor M16b that are connected in series. A control electrode of the transistor M16a is coupled to a control electrode of the transistor M16b and the second pull-down node PD2, a first electrode of the transistor M16a is coupled to a second electrode of the transistor M16b and the second node Q, a second electrode of the transistor M16a is coupled to the pull-up node PU, and a first electrode of the transistor M16b is coupled to the second voltage terminal V2.

In the case where the second potential boosting sub-circuit 120 includes the twenty-seventh transistor M27, when the twenty-seventh transistor M27 transmits the voltage of the seventh voltage terminal V7 to the second node Q under the control of the voltage of the pull-up node PU, a potential of the first electrode of the transistor M16a is the same as a potential of the second electrode of the transistor M16a, so that a leakage current of the transistor M13a is reduced.

In some embodiments, in a case where the shift register circuit RS includes the first pull-down control sub-circuit 104, as shown in FIG. 11, the shift register circuit RS further includes a first control sub-circuit 121 and a second control sub-circuit 122.

The first control sub-circuit 121 is coupled to the fifth clock signal terminal CLKE, the second voltage terminal V2 and the first pull-down node PD1.

The second control sub-circuit 122 is coupled to the first signal input terminal IN1, the second voltage terminal V2 and the first pull-down node PD1.

The first control sub-circuit 121 is configured to transmit the voltage of the second voltage terminal V2 to the first pull-down node PD1 under the control of the signal received at the fifth clock signal terminal CLKE.

The second control sub-circuit 122 is configured to transmit the voltage of the second voltage terminal V2 to the first pull-down node PD1 under the control of the signal received at the first signal input terminal IN1.

For example, as shown in FIG. 12, the first control sub-circuit 121 includes a twenty-third transistor M23.

A control electrode of the twenty-third transistor M23 is coupled to the fifth clock signal terminal CLKE, a first electrode of the twenty-third transistor M23 is coupled to the second voltage terminal V2, and a second electrode of the twenty-third transistor M23 is coupled to the first pull-down node PD1.

For example, as shown in FIGS. 12 and 13, the second control sub-circuit 122 includes a twenty-fourth transistor M24.

A control electrode of the twenty-fourth transistor M24 is coupled to the first signal input terminal IN1, a first electrode of the twenty-fourth transistor M24 is coupled to the second voltage terminal V2, and a second electrode of the twenty-fourth transistor M24 is coupled to the first pull-down node PD1.

In some embodiments, in a case where the shift register circuit RS includes the second pull-down control sub-circuit 111, as shown in FIG. 11, the shift register circuit RS further includes a third control sub-circuit 123 and a fourth control sub-circuit 124.

The third control sub-circuit 123 is coupled to the fifth clock signal terminal CLKE, the second voltage terminal V2 and the second pull-down node PD2.

The fourth control sub-circuit 124 is coupled to the first signal input terminal IN1, the second voltage terminal V2 and the second pull-down node PD2.

The third control sub-circuit 123 is configured to transmit the voltage of the second voltage terminal V2 to the second pull-down node PD2 under the control of the signal received at the fifth clock signal terminal CLKE.

The fourth control sub-circuit 124 is configured to transmit the voltage of the second voltage terminal V2 to the second pull-down node PD2 under the control of the signal received at the first signal input terminal IN1.

For example, as shown in FIGS. 12 and 13, the third control sub-circuit 123 includes a twenty-fifth transistor M25.

A control electrode of the twenty-fifth transistor M25 is coupled to the fifth clock signal terminal CLKE, a first electrode of the twenty-fifth transistor M25 is coupled to the second voltage terminal V2, and a second electrode of the twenty-fifth transistor M25 is coupled to the second pull-down node PD2.

For example, as shown in FIG. 12, the fourth control sub-circuit 124 includes a twenty-sixth transistor M26.

A control electrode of the twenty-sixth transistor M26 is coupled to the first signal input terminal IN1, a first electrode of the twenty-sixth transistor M26 is coupled to the second voltage terminal V2, and a second electrode of the twenty-sixth transistor M26 is coupled to the second pull-down node PD2.

It will be noted that, transistors used in the shift register circuit RS provided in the embodiments of the present disclosure may be thin film transistors (TFT), field effect transistors (FET) or other switching devices with same characteristics, which is not limited in the embodiments of the present disclosure.

In some embodiments, a control electrode of each transistor used in the shift register circuit RS is a gate of the transistor, a first electrode of the transistor is one of a source and a drain of the transistor, and a second electrode of the transistor is the other of the source and the drain of the transistor. Since the source and the drain of the transistor may be structurally symmetrical, there may be no difference between the source and the drain of the transistor in terms of structure. That is, there may be no difference between the first electrode and the second electrode of the transistor in structure in the embodiments of the present disclosure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuit provided in the embodiments of the present disclosure, the pull-up node PU, the first pull-down node PD1, the second pull-down node PD2, the first node H and the second node Q do not represent actual components, but rather represent junctions of related electrical connections in a circuit diagram. That is, these nodes are nodes equivalent to the junctions of the related electrical connections in the circuit diagram.

In the shift register circuit RS provided by the embodiments of the present disclosure, specific implementation manners of each sub-circuit are not limited to the manners described above, and may be any implementation manner used, such as a conventional connection manner known to a person skilled in the art, as long as corresponding functions can be achieved. The above examples do not limit the protection scope of the present disclosure. In practical applications, a person skilled in the art may choose to use or not to use one or more of the above sub-circuits according to actual situations. Various combinations and variations based on the above sub-circuits do not depart from principles of the present disclosure, and details are not repeated herein.

Hereinafter, operations of each transistor in the shift register circuit RS in different periods of a single image frame are described in detail by taking an example in which the above transistors are all N-type transistors.

It will be noted that, in a case where the shift register circuit RS includes the first pull-down control sub-circuit 104 and the second pull-down control sub-circuit 111, the first pull-down control sub-circuit 104 and the second pull-down control sub-circuit 111 operate alternately. A person skilled in the art may adjust the cycle of alternate operation of the first pull-down control sub-circuit 104 and the second pull-down control sub-circuit 111 by adjusting duty ratios of a signal received at the third voltage terminal V3 and a signal received at the fifth voltage terminal V5, which is not limited. For convenience of description, the embodiments of the present disclosure are described by taking an example in which the cycle of alternate operation of the first pull-down control sub-circuit 104 and the second pull-down control sub-circuit 111 is a single image frame.

The voltage of the second voltage terminal V2 is a DC low-level voltage, and the voltage of the fourth voltage terminal V4 is a DC low-level voltage. When the first pull-down control sub-circuit 104 operates, the voltage of the third voltage terminal V3 is a DC high-level voltage. When the second pull-down control sub-circuit 111 operates, the voltage of the fifth voltage terminal V5 is a DC high-level voltage.

Figure 14:
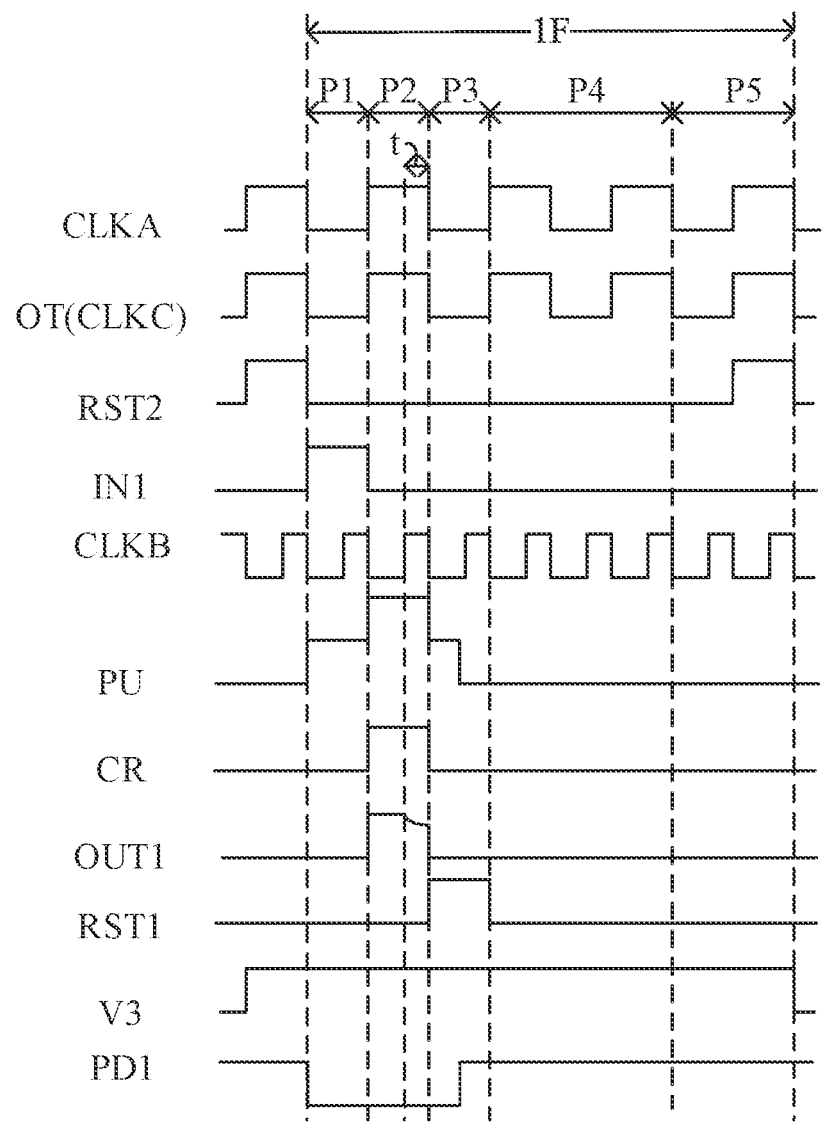
FIG. 14 is a driving timing diagram of a shift register circuit, in accordance with some embodiments.

In a first stage (P1) in a display period of a single image frame (F) as shown in FIG. 14, referring to FIG. 3, the first input sub-circuit 101 is turned on under the control of the signal received at the first signal input terminal IN1 to transmit the signal received at the second signal input terminal IN2 to the pull-up node PU, so as to charge the pull-up node PU. For example, as shown in FIG. 4, the second transistor M2 is turned on under the control of the signal of high-level voltage received at the first signal input terminal IN1 to transmit the signal received at the second signal input terminal IN2 to the pull-up node PU to charge the pull-up node PU and the first capacitor C1. In a case where the second signal input terminal IN2 and the first signal input terminal IN1 are different signal terminals, at this stage, the second signal input terminal IN2 transmits a DC high-level signal, at this stage, the second transistor M2 transmits the high-level signal received at the second signal input terminal IN2 to the pull-up node PU.

In the case where the second signal input terminal IN2 and the first signal input terminal IN1 are the same signal terminal, the first input sub-circuit 101 transmits the signal received at the first signal input terminal IN1 to the pull-up node PU under the control of the signal received at the first signal input terminal IN1, so as to charge the pull-up node PU. For example, as shown in FIG. 7, the second transistor M2 is turned on under the control of the signal of high-level voltage received at the first signal input terminal IN1 to transmit the signal received at the first signal input terminal IN1 to the pull-up node PU to charge the pull-up node PU and the first capacitor C1.

The output sub-circuit 102 is turned on under the control of the voltage of the pull-up node PU to transmit the signal received at the first clock signal terminal CLKA to the shift signal output terminal CR. For example, as shown in FIG. 4, the fourth transistor M4 is turned on under the control of a high-level voltage of the pull-up node PU to transmit a low-level signal received at the first clock signal terminal CLKA to the shift signal output terminal CR.

Moreover, the output sub-circuit 102 transmits the signal received at the output signal transmission terminal OT to the first scan signal output terminal OUT1. For example, as shown in FIG. 4, the third transistor M3 is turned off under the control of a low-level signal output from the shift signal output terminal CR, and the first scan signal output terminal OUT1 does not output a valid signal. Or, for example, as shown in FIGS. 5 and 7, the third transistor M3 is turned on under the control of the high-level voltage of the pull-up node PU. In this case, the output signal transmission terminal OT is the third clock signal terminal CLKC, and the third transistor M3 transmits a low-level signal received at the third clock signal terminal CLKC to the first scan signal output terminal OUT1.

Figure 15:
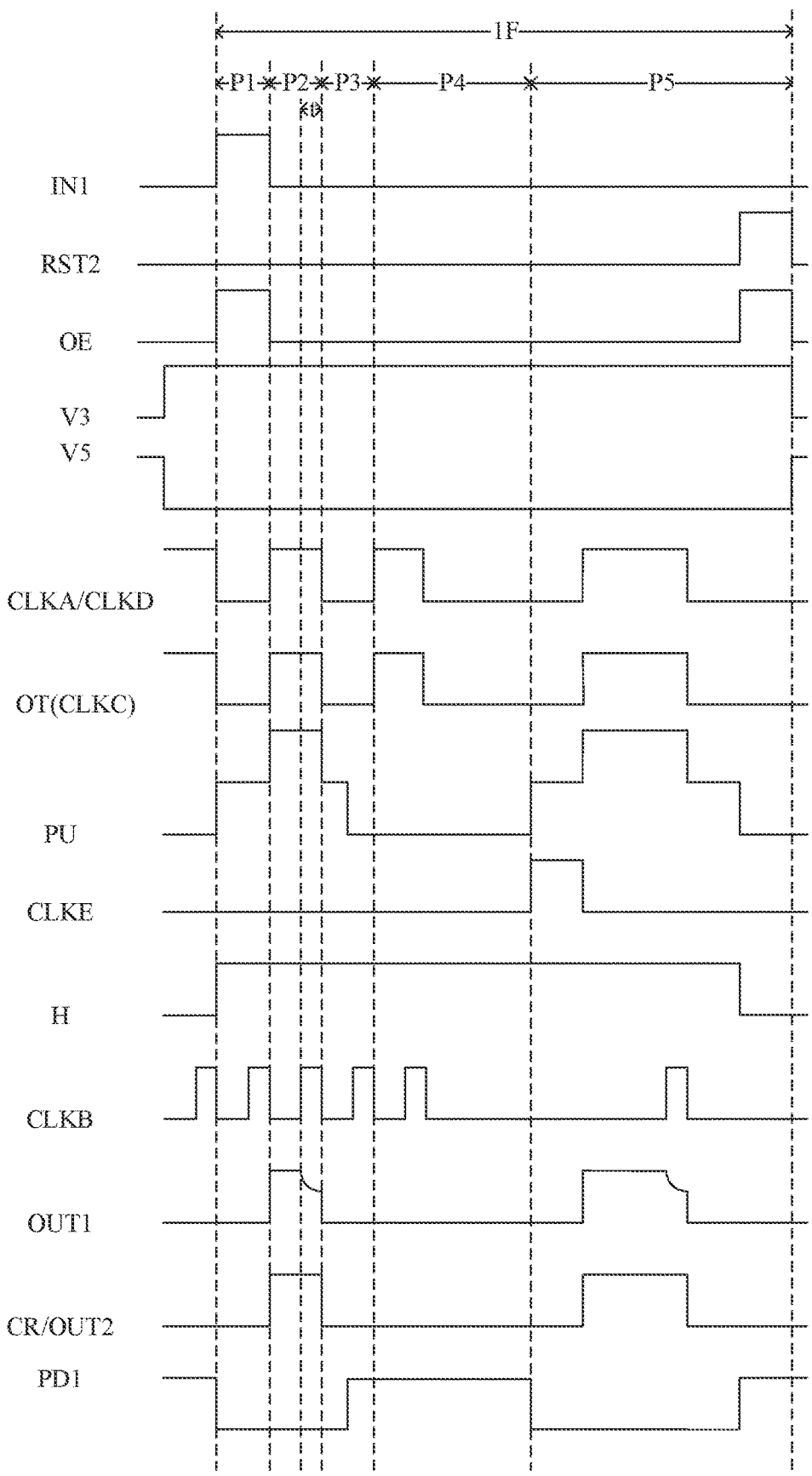
FIG. 15 is a driving timing diagram of another shift register circuit, in accordance with some embodiments.

In the first stage (P1) in the display period of an image frame (F) as shown in FIG. 15, referring to FIG. 6, in the case where the output sub-circuit 102 is further coupled to the second scan signal output terminal OUT2, the output sub-circuit 102 transmits a signal received at the fourth clock signal terminal CLKD to the second scan signal output terminal OUT2 under the control of the voltage of the pull-up node PU. For example, as shown in FIG. 7, the fifth transistor M5 is turned on under the control of the high-level voltage of the pull-up node PU to transmit a low-level signal received at the fourth clock signal terminal CLKD to the second scan signal output terminal OUT2. In addition, the second capacitor C2 and the first capacitor C1 are charged at the same time.

Referring to FIG. 6, the second input sub-circuit 116 transmits the signal received at the first signal input terminal IN1 to the first node H under the control of the signal received at the control signal terminal OE. For example, as shown in FIG. 7, the twentieth transistor M20 is turned on under the control of a high-level signal received at the control signal terminal OE to transmit a high-level signal received at the first signal input terminal IN1 to the first node H. In this case, a potential of the first node H is at a high level.

The storage sub-circuit 118 stores the signal that is transmitted to the first node H from the first signal input terminal IN1. For example, the third capacitor C3 stores the high-level signal from the first signal input terminal IN1.

It will be noted that, the third capacitor C3 may store the signal from the first signal input terminal IN1 until the end of the display period of the image frame, so that the stored signal may be used in a blanking stage.

Referring to FIG. 6, the compensation sub-circuit 117 is turned off under the control of the signal received at the fifth clock signal terminal CLKE. For example, as shown in FIG. 7, the twenty-first transistor M21 is turned on under the control of the high-level voltage of the first node H. However, the twenty-second transistor M22 is turned off under the control of a low-level signal received at the fifth clock signal terminal CLKE. Therefore, a fifth clock signal received at the fifth clock signal terminal CLKE will not be transmitted to the pull-up node PU.

In addition, the first pull-down control sub-circuit 104 transmits the voltage of the second voltage terminal V2 to the first pull-down node PD1 under the control of the voltage of the pull-up node PU. For example, as shown in FIGS. 4 and 7, the sixth transistor M6 is turned on under the control of a high-level voltage of the third voltage terminal V3 and the seventh transistor M7 is turned on under the control of the high-level voltage of the pull-up node PU. Since a width-to-length ratio of a channel of the seventh transistor M7 is greater than a width-to-length ratio of a channel of the sixth transistor M6, the seventh transistor M7 transmits a low-level voltage of the second voltage terminal V2 to the first pull-down node PD1. In this case, a potential of the first pull-down node PD1 is at a low level.

In some embodiments, referring to FIG. 11, the second control sub-circuit 122 is turned on under the control of the signal received at the first signal input terminal IN1 to transmit the voltage of the second voltage terminal V2 to the first pull-down node PD1. For example, as shown in FIG. 12, the twenty-fourth transistor M24 is turned on under the control of the high-level signal received at the first signal input terminal IN1 to transmit the low-level voltage of the second voltage terminal V2 to the first pull-down node PD1, so as to denoise the first pull-down node PD1.

In some embodiments, referring to FIG. 11, the second potential boosting sub-circuit 120 is turned on under the control of the voltage of the first node H to transmit the voltage of the seventh voltage terminal V7 to the second input sub-circuit 116. For example, as shown in FIG. 12, in a case where the voltage of the first node H is at a high level, the twenty-eighth transistor M28 is turned on to transmit the high-level voltage of the seventh voltage terminal V7 to the second electrode of the transistor M20a and the first electrode of the transistor M20b. Since a potential of the first electrode of the transistor M20a is a potential of the high-level signal of the first signal input terminal IN1, and a potential of the second electrode of the transistor M20b is the high-level voltage of the first node H, for each of the transistor M20a and the transistor M20b, a potential of the first electrode thereof is the same as a potential of the second electrode thereof. Therefore, leakage currents of the transistor M20a and the transistor M20b may be reduced, and a stability of the potential of the first node H may be improved.

In addition, in some embodiments, in a case where the first pull-down control sub-circuit 104 does not operate and the second pull-down control sub-circuit 111 operates, referring to FIG. 6, the second pull-down control sub-circuit 111 transmits the voltage of the second voltage terminal V2 to the second pull-down node PD2 under the control of the voltage of the pull-up node PU. For example, as shown in FIG. 7, the fourteenth transistor M14 is turned on under the control of the high-level voltage of the fifth voltage terminal V5, and the fifteenth transistor M15 is turned on under the control of the high-level voltage of the pull-up node PU. Since a width-to-length ratio of a channel of the fifteenth transistor M15 is greater than a width-to-length ratio of a channel of the fourteenth transistor M14, the fifteenth transistor M15 transmits the low-level voltage of the second voltage terminal V2 to the second pull-down node PD2. In this case, a potential of the second pull-down node PD2 is at a low-level.

In some embodiments, referring to FIG. 11, the fourth control sub-circuit 124 is turned on under the control of the signal received at the first signal input terminal IN1 to transmit the voltage of the second voltage terminal V2 to the second pull-down node PD2. For example, as shown in FIG. 12, the twenty-sixth transistor M26 is turned on under the control of the high-level signal received at the first signal input terminal IN1 to transmit the low-level voltage of the second voltage terminal V2 to the second pull-down node PD2, so as to denoise the second pull-down node PD2.

In a second stage (P2) in the display period of the image frame as shown in FIG. 14, referring to FIG. 4, the output sub-circuit 102 is turned on under the control of the voltage of the pull-up node PU to transmit the signal received at the first clock signal terminal CLKA to the shift signal output terminal CR. For example, as shown in FIG. 0.4, the first capacitor C1 releases electric charges stored therein to the pull-up node PU, and the fourth transistor M4 is turned on under the control of the high-level voltage of the pull-up node PU to transmit a high-level signal received at the first clock signal terminal CLKA to the shift signal output terminal CR. In this case, a potential of the signal of the shift signal output terminal CR is at a high level.

Moreover, the output sub-circuit 102 transmits the signal received at the output signal transmission terminal OT to the first scan signal output terminal OUT1. For example, as shown in FIG. 4, the third transistor M3 is turned on under the control of the high-level signal output from the shift signal output terminal CR. In the case where the output signal transmission terminal OT is the first voltage terminal V1, the first voltage terminal V1 transmits a DC high-level voltage, and the third transistor M3 transmits the high-level voltage of the first voltage terminal V1 to the first scan signal output terminal OUT1. Or, for example, as shown in FIGS. 5 and 7, the first capacitor C1 releases the electrical charges stored therein to the pull-up node PU, and the third transistor M3 is turned on under the control of the high-level voltage of the pull-up node PU. In this case, the output signal transmission terminal OT is the third clock signal terminal CLKC, and the third transistor M3 transmits the high level signal received at the third clock signal terminal CLKC to the first scan signal output terminal OUT1. In this case, a potential of the signal of the first scan signal output terminal OUT1 is at a high-level.

It will be understood that, since a voltage difference between the first electrode and the second electrode of the first capacitor C1 will not change abruptly, the first capacitor C1 will further lift a potential of the pull-up node PU through a coupling bootstrap effect of itself in the second stage (P2).

As shown in FIG. 14, in the predetermined time t before the first scan signal output terminal OUT1 stops outputting the signal from the output signal transmission terminal OT, referring to FIG. 4, the output control sub-circuit 103 transmits the signal received at the chamfering signal terminal VA to the first scan signal output terminal OUT1 in response to the signal received at the second clock signal terminal CLKB. The voltage amplitude of the signal received at the chamfering signal terminal VA is within the variation range of the voltage amplitude of the signal received at the first scan signal output terminal OUT1.

For example, as shown in FIG. 4, in the case where the output signal transmission terminal OT is the first voltage terminal V1, the third transistor M3 transmits the high-level voltage of the first voltage terminal V1 to the first scan signal output terminal OUT1. In this case, the voltage of the signal of the first scan signal output terminal OUT1 is the high-level voltage of the first voltage terminal V1. In this case, in the predetermined time t before the first scan signal output terminal OUT1 stops outputting the signal from the output signal transmission terminal OT, the first transistor M1 is turned on in response to a high-level signal received at the second clock signal terminal CLKB to transmit the signal received at the chamfering signal terminal VA to the first scan signal output terminal OUT1. The voltage amplitude of the signal received at the chamfering signal terminal VA is less than an amplitude of the high-level voltage of the first voltage terminal V1.

For example, as shown in FIG. 5, in the case where the output signal transmission terminal OT is the third clock signal terminal CLKC, the third transistor M3 transmits a high-level voltage of the third clock signal terminal CLKC to the first scan signal output terminal OUT1. In this case, the voltage of the signal of the first scan signal output terminal OUT1 is the high-level voltage of the third clock signal terminal CLKC. In this case, in the predetermined time t before the first scan signal output terminal OUT1 stops outputting the signal from the output signal transmission terminal OT, the first transistor M1 is turned on in response to the high level signal received at the second clock signal terminal CLKB to transmit the signal received at the chamfering signal terminal VA to the first scan signal output terminal OUT1. The voltage amplitude of the signal received at the chamfering signal terminal VA is less than an amplitude of the high-level voltage of the third clock signal terminal CLKC.

Likewise, in a case where the chamfering signal terminal VA is the second voltage terminal V2 (as shown in FIGS. 8 and 9), the voltage amplitude of the signal received at the chamfering signal terminal VA is an amplitude of the low-level voltage of the second voltage terminal V2. In this case, the first transistor M1 transmits the voltage of the second voltage terminal V2 to the first scan signal output terminal OUT1, which may affect a high-level signal of the first scan signal output terminal OUT1, so that the waveform of the signal of the first scan signal output terminal OUT1 will be chamfered. Or, in a case where the chamfering signal terminal VA is the fourth voltage terminal V4 (as shown in FIG. 7), the voltage amplitude of the signal received at the chamfering signal terminal VA is an amplitude of a low-level voltage of the fourth voltage terminal V4. In this case, the first transistor M1 transmits the voltage of the fourth voltage terminal V4 to the first scan signal output terminal OUT1, which may affect the high-level signal of the first scan signal output terminal OUT1, so that the waveform of the signal of the first scan signal output terminal OUT1 will be chamfered.

Therefore, in the predetermined time t before the first scan signal output terminal OUT1 stops outputting the signal from the output signal transmission terminal OT, the potential of the high-level signal of the first scan signal output terminal OUT1 is affected by the signal received at the chamfering signal terminal VA and decreases. As a result, the signal output from the first scan signal output terminal OUT1 changes from a high-level signal to a low-level signal with a reduced variation amplitude and an increased change time. The chamfering effect (e.g., the arc-shaped chamfering effect) appears on the waveform of the signal output from the first scan signal output terminal OUT1, which reduces the change gradient of the potential of the signal output from the first scan signal output terminal OUT1. In this way, it may be possible to avoid the problem that the afterimage appears on the display apparatus due to the flickering of the light-emitting device, and thus improve the display effect.

In the second stage (P2) in the display period of the image frame (F) as shown in FIG. 15, referring to FIG. 6, in the case where the output sub-circuit 102 is further coupled to the second scan signal output terminal OUT2, the output sub-circuit 102 transmits the signal received at the fourth clock signal terminal CLKD to the second scan signal output terminal OUT2 under the control of the voltage of the pull-up node PU. For example, as shown in FIG. 7, the second capacitor C2 releases the electrical charges stored therein to the pull-up node PU, and the fifth transistor M5 is turned on under the control of the voltage of the pull-up node PU to transmit the signal received at the fourth clock signal terminal CLKD to the second scan signal output terminal OUT2.

It will be noted that, in the case where the output signal transmission terminal OT is the third clock signal terminal CLKC, waveforms of the signal received at the first clock signal terminal CLKA, the signal received at the third clock signal terminal CLKC and the signal received at the fourth clock signal terminal CLKD are the same, but it does not mean that the three signals are the same signal.

In addition, the first pull-down control sub-circuit 104 transmits the voltage of the second voltage terminal V2 to the first pull-down node PD1. For example, the potential of the first pull-down node PD1 is at a low level, and as for a specific mode of operation, reference may be made to the description in the first stage, which will not be repeated here.

In addition, in some embodiments, in the case where the first pull-down control sub-circuit 104 does not operate and the second pull-down control sub-circuit 111 operates, the second pull-down control sub-circuit 111 transmits the voltage of the second voltage terminal V2 to the second pull-down node PD2, for example, the potential of the second pull-down node PD2 is at a low level, as for a specific mode of operation, reference may be made to the description in the first stage (P1), which will not be repeated here.

In a third stage (P3) in the display period of the image frame as shown in FIG. 14, referring to FIG. 3, the first reset sub-circuit 108 is turned on under the control of the signal received at the first reset signal terminal RST1 to transmit the voltage of the second voltage terminal V2 to the pull-up node PU, so as to reset the potential of the pull-up node PU. For example, as shown in FIG. 4, the eleventh transistor M11 is turned on under the control of a high-level signal received at the first reset signal terminal RST1 to transmit the low-level voltage of the second voltage terminal V2 to the pull-up node PU. In this case, the potential of the pull-up node PU is at a low level.

Referring to FIG. 3, the first pull-down control sub-circuit 104 transmits the voltage of the third voltage terminal V3 to the first pull-down node PD1 under the control of the signal received at the third voltage terminal V3. For example, as shown in FIG. 4, the seventh transistor M7 is turned off under the control of the low voltage of the pull-up node PU. The sixth transistor M6 is turned on under the control of the high-level voltage of the third voltage terminal V3 to transmit the high-level voltage of the third voltage terminal V3 to the first pull-down node PD1. In this case, the potential of the first pull-down node PD1 is at a high level.

Referring to FIG. 3, the first noise reduction sub-circuit 105 transmits the voltage of the second voltage terminal V2 to the pull-up node PU under the control of the voltage of the first pull-down node PD1, so as to denoise the pull-up node PU. For example, as shown in FIG. 4, the eighth transistor M8 is turned on under the control of the high-level voltage of the first pull-down node PD1 to transmit the low-level voltage of the second voltage terminal V2 to the pull-up node PU, so that the potential of the pull-up node PU is at a low level.

Referring to FIG. 3, the second noise reduction sub-circuit 106 transmits the voltage of the fourth voltage terminal V4 to the first scan signal output terminal OUT1 under the control of the first pull-down node PD1, so as to denoise the first scan signal output terminal OUT1. For example, as shown in FIG. 4, the ninth transistor M9 is turned on under the control of the high-level voltage of the first pull-down node PD1 to transmit the low-level voltage of the fourth voltage terminal V4 to the first scan signal output terminal. In this case, the signal of the first scan signal output terminal OUT1 is a low-level signal. Or, in the case where the fourth voltage terminal V4 and the second voltage terminal V2 are the same voltage terminal, as shown in FIGS. 8 and 9, the ninth transistor M9 is turned on under the control of the high-level voltage of the first pull-down node PD1 to transmit the low-level voltage of the second voltage terminal V2 to the first scan signal output terminal OUT1. In this case, the signal of the first scan signal output terminal OUT1 is a low-level signal.

Referring FIG. 3, the third noise reduction sub-circuit 107 transmits the voltage of the second voltage terminal V2 to the shift signal output terminal CR under the control of the voltage of the first pull-down node PD1, so as to denoise the shift signal output terminal CR. For example, as shown in FIG. 4, the tenth transistor M10 is turned on under the control of the high-level voltage of the first pull-down node PD1 to transmit the low-level voltage of the second voltage terminal V2 to the shift signal output terminal CR. In this case, the signal of the shift signal output terminal CR is a low-level signal.

In the third stage (P3) in the display period of the image frame (F) as shown in FIG. 15, referring to FIG. 6, in the case where the output sub-circuit 102 is further coupled to the second scan signal output terminal OUT2, the fourth noise reduction sub-circuit 109 is turned on under the control of the voltage of the first pull-down node PD1 to transmit the voltage of the fourth voltage terminal V4 to the second scan signal output terminal OUT2, so as to denoise the second scan signal output terminal OUT2. For example, as shown in FIG. 7, the twelfth transistor M12 is turned on under the control of the high-level voltage of the first pull-down node PD1 to transmit the low-level voltage of the fourth voltage terminal V4 to the second scan signal output terminal OUT2. In this case, the signal of the second scan signal output terminal OUT2 is a low-level signal.

In addition, in some embodiments, in the case where the first pull-down control sub-circuit 104 does not operate and the second pull-down control sub-circuit 111 operates, referring to FIG. 6, the second pull-down control sub-circuit 111 transmits the voltage of the fifth voltage terminal V5 to the second pull-down node PD2 under the control of the voltage of the fifth voltage terminal V5. For example, as shown in FIG. 7, the fifteenth transistor M15 is turned off under the control of the low-level voltage of the pull-up node PU. The fourteenth transistor M14 is turned on under the control of the high-level voltage of the fifth voltage terminal V5 to transmit the high-level voltage of the fifth voltage terminal V5 to the second pull-down node PD2. In this case, the potential of the second pull-down node PD2 is at a high level.

Referring to FIG. 6, the fifth noise reduction sub-circuit 112 transmits the voltage of the second voltage terminal V2 to the pull-up node PU under the control of the voltage of the second pull-down node PD2. For example, as shown in FIG. 7, the sixteenth transistor M16 is turned on under the control of the high-level voltage of the second pull-down node PD2 to transmit the low-level voltage of the second voltage terminal V2 to the pull-up node PU, so that the potential of the pull-up node PU is at a low level.

Referring FIG. 6, the sixth noise reduction sub-circuit 113 transmits the voltage of the fourth voltage terminal V4 to the first scan signal output terminal OUT1 under the control of the second pull-down node PD2, so as to denoise the first scan signal output terminal OUT1. For example, as shown in FIG. 7, the seventeenth transistor M17 is turned on under the control of the high-level voltage of the second pull-down node PD2 to transmit the low-level voltage of the fourth voltage terminal V4 to the first scan signal output terminal OUT1. In this case, the signal of the first scan signal output terminal OUT1 is a low-level signal.

Referring to FIG. 6, the seventh noise reduction sub-circuit 114 transmits the voltage of the second voltage terminal V2 to the shift signal output terminal CR under the control of the voltage of the second pull-down node PD2, so as to denoise the shift signal output terminal CR. For example, as shown in FIG. 7, the eighteenth transistor M18 is turned on under the control of the high-level voltage of the second pull-down node PD2 to transmit the low-level voltage of the second voltage terminal V2 to the shift signal output terminal CR. In this case, the signal of the shift signal output terminal CR is a low-level signal.

Referring to FIG. 6, in the case where the output sub-circuit 102 is further coupled to the second scan signal output terminal OUT2, the eighth noise reduction sub-circuit 115 is turned on under the control of the voltage of the second pull-down node PD2 to transmit the voltage of the fourth voltage terminal V4 to the second scan signal output terminal OUT2, so as to denoise the second scan signal output terminal OUT2. For example, as shown in FIG. 7, the nineteenth transistor M19 is turned on under the control of the high-level voltage of the second pull-down node PD2 to transmit the low-level voltage of the fourth voltage terminal V4 to the second scan signal output terminal OUT2. In this case, the signal of the second scan signal output terminal OUT2 is a low-level signal.

It will be noted that, during a period of time after the third stage (P3) begins, referring to FIG. 7, due to the bootstrapping effect of the first capacitor C1 and the second capacitor C2, the potential of the pull-up node PU decreases but remains at a high level, the third transistor M3, the fourth transistor M4 and the fifth transistor M5 are still kept in on state. Thus, the low-level signal of the first clock signal CLKA is transmitted to the shift signal output terminal CR through the fourth transistor M4. The output signal transmission terminal OT is the third clock signal terminal CLKC, the third transistor M3 transmits the low-level signal of the third clock signal terminal CLKC to the first scan signal output terminal OUT1, and the fifth transistor M5 transmits the low-level signal of the fourth clock signal terminal CLKD to the second scan signal output terminal OUT2, so as to realize a noise reduction of the shift signal output terminal CR, the first scan signal output terminal OUT1 and the second scan signal output terminal OUT2.

In a fourth stage (P4) in the display period of the image frame as shown in FIG. 14, referring to FIG. 3, the first pull-down control sub-circuit 104 transmits the voltage of the second voltage terminal V2 to the first pull-down node PD1 under the control of the voltage of the pull-up node PU and the voltage of the third voltage terminal V3. For example, as shown in FIG. 4, the seventh transistor M7 is turned off under the control of the low voltage of the pull-up node PU. The sixth transistor M6 is turned on under the control of the high-level voltage of the third voltage terminal V3 to transmit the high-level voltage of the third voltage terminal V3 to the first pull-down node PD1. In this case, the potential of the first pull-down node PD1 is at a high level.

Referring to FIGS. 3 and 6, the first noise reduction sub-circuit 105 is turned on under the control of the voltage of the first pull-down node PD1 to transmit the voltage of the second voltage terminal V2 to the pull-up node PU. For example, as shown in FIG. 4, the eighth transistor M8 is turned on under the control of the high-level voltage of the first pull-down node PD1 to transmit the low-level voltage of the second voltage terminal V2 to the pull-up node PU, so that the potential of the pull-up node PU is at a low level.

Referring to FIGS. 3 and 6, the second noise reduction sub-circuit 106 is turned on under the control of the voltage of the first pull-down node PD1 to transmit the voltage of the fourth voltage terminal V4 to the first scan signal output terminal OUT1. For example, as shown in FIG. 4, the ninth transistor M9 is turned on under the control of the high-level voltage of the first pull-down node PD1 to transmit the low-level voltage of the fourth voltage terminal V4 to the first scan signal output terminal OUT1. In this case, the signal of the first scan signal output terminal OUT1 is a low-level signal. Or, in the case where the fourth voltage terminal V4 and the second voltage terminal V2 are the same voltage terminal, as shown in FIGS. 8 and 9, the ninth transistor M9 is turned on under the control of the high-level voltage of the first pull-down node PD1 to transmit the low-level voltage of the second voltage terminal V2 to the first scan signal output terminal OUT1. In this case, the signal of the first scan signal output terminal OUT1 is a low-level signal.

Referring to FIGS. 3 and 6, the third noise reduction sub-circuit 107 is turned on under the control of the voltage of the first pull-down node PD1 to transmit the voltage of the fourth voltage terminal V4 to the shift signal output terminal CR. For example, as shown in FIG. 4, the tenth transistor M10 is turned on under the control of the high-level voltage of the first pull-down node PD1 to transmit the low-level voltage of the second voltage terminal V2 to the shift signal output terminal CR. In this case, the signal of the shift signal output terminal CR is a low-level signal.

In the fourth stage (P4) in the display period of the image frame (F) as shown in FIG. 15, referring to FIG. 6, in the case where the output sub-circuit 102 is further coupled to the second scan signal output terminal OUT2, the fourth noise reduction sub-circuit 109 is turned on under the control of the voltage of the first pull-down node PD1 to transmit the voltage of the fourth voltage terminal V4 to the second scan signal output terminal OUT2, so as to denoise the second scan signal output terminal OUT2. For example, as shown in FIG. 7, the twelfth transistor M12 is turned on under the control of the high-level voltage of the first pull-down node PD1 to transmit the low-level voltage of the fourth voltage terminal V4 to the second scan signal output terminal OUT2. In this case, the signal of the second scan signal output terminal OUT2 is a low-level signal.

In addition, in some embodiments, in the case where the first pull-down control sub-circuit 104 does not operate and the second pull-down control sub-circuit 111 operates, referring to FIG. 6, the second pull-down control sub-circuit 111 transmits the voltage of the fifth voltage terminal V5 to the second pull-down node PD2 under the control of the voltage of the fifth voltage terminal V5. For example, as shown in FIG. 7, the fifteenth transistor M15 is turned off under the control of the low-level voltage of the pull-up node PU. The fourteenth transistor M14 is turned on under the control of the high-level voltage of the fifth voltage terminal V5 to transmit the high-level voltage of the fifth voltage terminal V5 to the second pull-down node PD2. In this case, the potential of the second pull-down node PD2 is at a high level.

Referring to FIG. 6, the fifth noise reduction sub-circuit 112 transmits the voltage of the second voltage terminal V2 to the pull-up node PU under the control of the voltage of the second pull-down node PD2. For example, as shown in FIG. 7, the sixteenth transistor M16 is turned on under the control of the high-level voltage of the second pull-down node PD2 to transmit the low-level voltage of the second voltage terminal V2 to the pull-up node PU, so that the potential of the pull-up node PU is at a low level.

Referring to FIG. 6, the sixth noise reduction sub-circuit 113 transmits the voltage of the fourth voltage terminal V4 to the first scan signal output terminal OUT1 under the control of the second pull-down node PD2, so as to denoise the first scan signal output terminal OUT1. For example, as shown in FIG. 7, the seventeenth transistor M17 is turned on under the control of the high-level voltage of the second pull-down node PD2 to transmit the low-level voltage of the fourth voltage terminal V4 to the first scan signal output terminal OUT1. In this case, the potential of the first scan signal output terminal OUT1 is a low-level signal.

Referring to FIG. 6, the seventh noise reduction sub-circuit 114 transmits the voltage of the second voltage terminal V2 to the shift signal output terminal CR under the control of the voltage of the second pull-down node PD2, so as to denoise the shift signal output terminal CR. For example, as shown in FIG. 7, the eighteenth transistor M18 is turned on under the control of the high-level voltage of the second pull-down node PD2 to transmit the low-level voltage of the second voltage terminal V2 to the shift signal output terminal CR. In this case, the signal of the shift signal output terminal CR is a low-level signal.

Referring to FIG. 6, in the case where the output sub-circuit 102 is further coupled to the second scan signal output terminal OUT2, the eighth noise reduction sub-circuit 115 is turned on under the control of the voltage of the second pull-down node PD2 to transmit the voltage of the fourth voltage terminal V4 to the second scan signal output terminal OUT2, so as to denoise the second scan signal output terminal OUT2. For example, as shown in FIG. 7, the nineteenth transistor M19 is turned on under the control of the high-level voltage of the second pull-down node PD2 to transmit the low-level voltage of the fourth voltage terminal V4 to the second scan signal output terminal OUT2. In this case, the signal of the second scan signal output terminal OUT2 is a low-level signal.

It will be noted that, from the first stage to the fourth stage, the signal of the fifth clock signal terminal CLKE maintains at a low level and the twenty-second transistor M22 is in an off state. In this way, the potentials of the first node H and the pull-up node PU may be separated to prevent the voltage of the first node H from affecting the output signal during the display period.

In a blanking stage (P5) of the image frame as shown in FIG. 15, referring to FIG. 6, the storage sub-circuit 118 stores the voltage of the first node H and holds the voltage of the first node H. The compensation sub-circuit 117 is turned on under the control of the voltage of the first node H and the signal received at the fifth clock signal terminal CLKE to transmit the signal received at the fifth clock signal terminal CLKE to the pull-up node PU, so that the output sub-circuit 102 is turned on to transmit a signal, so as to compensate the pixel driving circuit 20. As shown in FIG. 7, the potential of the first node H maintains at a high level due to a holding effect of the third capacitor C3. The twenty-first transistor M21 is turned on under the control of the high-level voltage of the first node H, and the twenty-second transistor M22 is turned on under the control of the high-level signal received at the fifth clock signal terminal CLKE, so that the high-level signal received at the fifth clock signal terminal CLKE is transmitted to the pull-up node PU through the twenty-first transistor M21 and the twenty-second transistor M22, and the first capacitor C1 and the second capacitor C2 are charged. In this case, since the signal received at the third clock signal terminal CLKC and the signal received at the fourth clock signal terminal CLKD are both low-level signals, the first scan signal output terminal OUT1 and the second scan signal output terminal OUT2 both output low-level signals.

In addition, in some embodiments, referring to FIG. 11, the first control sub-circuit 121 is turned on under the control of the signal received at the fifth clock signal terminal CLKE to transmit the voltage of the second voltage terminal V2 to the first pull-down node PD1. For example, as shown in FIG. 12, the twenty-third transistor M23 is turned on under the control of the high-level signal received at the fifth clock signal terminal CLKE to transmit the low-level voltage of the second voltage terminal V2 to the first pull-down node PD1, so as to denoise the first pull-down node PD1.

Or, in some embodiments, in a case where the shift register circuit RS further includes the second pull-down control sub-circuit 111, referring to FIG. 11, the third control sub-circuit 123 is turned on under the control of the signal received at the fifth clock signal terminal CLKE to transmit the voltage of the second voltage terminal V2 to the second pull-down node PD2. For example, as shown in FIG. 12, the twenty-fifth transistor M25 is turned on under the control of the high-level signal received at the fifth clock signal terminal CLKE to transmit the low-level voltage of the second voltage terminal V2 to the second pull-down node PD2, so as to denoise the second pull-down node PD2.

After that, since the signal received at the fifth clock signal terminal CLKE is a low-level signal, the twenty-second transistor M22 is turned off, and the signal received at the fifth clock signal terminal CLKE will not be transmitted to the pull-up node PU. In this case, the pull-up node PU is in a floating state, and the potential of the pull-up node PU maintains at a high level as in the previous stage. Moreover, due to the bootstrapping effect of the first capacitor C1 and the second capacitor C2, the potential of the pull-up node PU will be lifted higher. In this case, the third transistor M3 and the fifth transistor M5 are both turned on. The third transistor M3 is able to transmit the high-level signal received at the third clock signal terminal CLKC to the first scan signal output terminal OUT1, and the fifth transistor M5 is able to transmit the high-level signal received at the fourth clock signal terminal CLKD to the second scan signal output terminal OUT2, so as to compensate the pixel driving circuit 20.

Moreover, in the predetermined time before the first scan signal output terminal OUT1 stops outputting the signal from the output signal transmission terminal OT, the first transistor M1 in the output control sub-circuit 103 is turned on under the control of the high-level signal received at the second clock signal terminal CLKB to transmit the signal received at the chamfering signal terminal VA to the first scan signal output terminal OUT1, so that the waveform of the signal of the first scan signal output terminal OUT1 is chamfered.

In addition, in some embodiments, referring to FIG. 11, the second potential boosting sub-circuit 120 is turned on under the control of the voltage of the first node H to transmit the voltage of the seventh voltage terminal V7 to the second input sub-circuit 116. For example, as shown in FIG. 12, in a case where the voltage of the first node H is at a high level, the twenty-eighth transistor M28 is turned on to transmit the high-level voltage of the seventh voltage terminal V7 to the second electrode of the transistor M20a and the first electrode of the transistor M20b. In this case, the potential of the first electrode of the transistor M20b is equal to the potential of the second electrode of the transistor M20b, so that the leakage current of the transistor M20b is reduced, and the stability of the potential of the first node H is improved.

Referring to FIG. 11, the first potential boosting sub-circuit 119 transmits the voltage of the seventh voltage terminal V7 to the second node Q under the control of the voltage of the pull-up node PU. For example, as shown in FIG. 12, the twenty-seventh transistor M27 is turned on under the control of the high-level voltage of the pull-up node PU to transmit the high-level voltage of the seventh voltage terminal V7 to the second node Q. In this case, the potential of the second node Q is at a high level. For example, potentials of the first electrode and the second electrode of the transistor M22b in the compensation sub-circuit 117 are both at a high level, which reduces the leakage current of the transistor M22b. Moreover, in a case where the potential of the first electrode of the transistor M22a is a potential of the high-level signal from the fifth clock signal terminal CLKE, potentials of the first electrode and the second electrode of the transistor M22a are the same, the leakage currents of the transistors in the compensation circuit 117 may be reduced, and the stability of the potential of the pull-up node PU may be improved.

Likewise, for example, as shown in FIG. 12, for each of the transistor M8a in the first noise reduction sub-circuit 105, the transistor M11a in the first reset sub-circuit 108, the transistor M13a in the second reset sub-circuit 110 and the transistor M16a in the fifth noise reduction sub-circuit 112, the potentials of the first electrode and the second electrode thereof are all at a high level. In this case, leakage currents of the transistors in the first noise reduction sub-circuit 105, the first reset sub-circuit 108, the second reset sub-circuit 110 and the fifth noise reduction sub-circuit 112 may be reduced, and the stability of the potential of the pull-up node PU may be improved.

It will be noted that, in a case where the potential of the pull-up node PU is at a high level, the first pull-down control sub-circuit 104 operates, so that the potential of the first pull-down node PD1 is at a low level; or, the second pull-down control sub-circuit 111 operates, so that the potential of the second pull-down node PD2 is at a low level.

After that, due to the bootstrapping effect of the first capacitor C1 and the second capacitor C2, the potential of the pull-up node PU is reduced but still maintains at a high level, and the third transistor M3 and the fifth transistor M5 still remain turned on. In this case, the signal of the third clock signal terminal CLKC varies from a high level to a low level, and the third transistor M3 transmits the low-level signal to the first scan signal output terminal OUT1. The signal of the fourth clock signal terminal CLKD varies from a high level to a low level, and the fifth transistor M5 transmits the low-level signal to the second scan signal output terminal OUT2.

After that, the twentieth transistor M20 is turned on under the control of the high-level signal received at the control signal terminal OE to transmit the low-level signal received at the first signal input terminal IN1 to the first node H, so as to reset the potential of the first node H.

Moreover, referring to FIG. 3, the second reset sub-circuit 110 transmits the voltage of the second voltage terminal V2 to the pull-up node PU under the control of the signal received at the second reset signal terminal RST2, so as to reset the pull-up node PU. For example, as shown in FIG. 4, the thirteenth transistor M13 is turned on under the control of the high-level signal received at the second reset signal terminal RST2 to transmit the low-level voltage of the second voltage terminal V2 to the pull-up node PU. In this case, the potential of the pull-up node PU is at a low level.

In this stage, referring to FIG. 3, the first pull-down control sub-circuit 104 transmits the voltage of the second voltage terminal V2 to the first pull-down node PD1 under the control of the voltage of the pull-up node PU and the voltage of the third voltage terminal V3. For example, as shown in FIG. 4, the seventh transistor M7 is turned off under the control of the low voltage of the pull-up node PU. The sixth transistor M6 is turned on under the control of the high-level voltage of the third voltage terminal V3 to transmit the high-level voltage of the third voltage terminal V3 to the first pull-down node PD1. In this case, the potential of the first pull-down node PD1 is at a high level.

Referring to FIGS. 3 and 6, the first noise reduction sub-circuit 105 is turned on under the control of the voltage of the first pull-down node PD1 to transmit the voltage of the second voltage terminal V2 to the pull-up node PU. For example, as shown in FIG. 4, the eighth transistor M8 is turned on under the control of the high-level voltage of the first pull-down node PD1 to transmit the low-level voltage of the second voltage terminal V2 to the pull-up node PU, so that the potential of the pull-up node PU is at a low level.

Referring to FIGS. 3 and 6, the second noise reduction sub-circuit 106 is turned on under the control of the voltage of the first pull-down node PD1 to transmit the voltage of the fourth voltage terminal V4 to the first scan signal output terminal OUT1. For example, as shown in FIG. 4, the ninth transistor M9 is turned on under the control of the high-level voltage of the first pull-down node PD1 to transmit the low-level voltage of the fourth voltage terminal V4 to the first scan signal output terminal OUT1. In this case, the signal of the first scan signal output terminal OUT1 is a low-level signal. Or, in the case where the fourth voltage terminal V4 and the second voltage terminal V2 are the same voltage terminal, as shown in FIGS. 8 and 9, the ninth transistor M9 is turned on under the control of the high-level voltage of the first pull-down node PD1 to transmit the low-level voltage of the second voltage terminal V2 to the first scan signal output terminal OUT1. In this case, the signal of the first scan signal output terminal OUT1 is a low-level signal.

Referring to FIGS. 3 and 6, the third noise reduction sub-circuit 107 is turned on under the control of the voltage of the first pull-down node PD1 to transmit the voltage of the fourth voltage terminal V4 to the shift signal output terminal CR. For example, as shown in FIG. 4, the tenth transistor M10 is turned on under the control of the high-level voltage of the first pull-down node PD1 to transmit the low-level voltage of the second voltage terminal V2 to the shift signal output terminal CR. In this case, the signal of the shift signal output terminal CR is a low-level signal.

Referring to FIG. 6, in the case where the output sub-circuit 102 is further coupled to the second scan signal output terminal OUT2, the fourth noise reduction sub-circuit 109 is turned on under the control of the voltage of the first pull-down node PD1 to transmit the voltage of the fourth voltage terminal V4 to the second scan signal output terminal OUT2, so as to denoise the second scan signal output terminal OUT2. For example, as shown in FIG. 7, the twelfth transistor M12 is turned on under the control of the high-level voltage of the first pull-down node PD1 (as shown in FIG. 15) to transmit the low-level voltage of the fourth voltage terminal V4 to the second scan signal output terminal OUT2. In this case, the signal of the second scan signal output terminal OUT2 is a low-level signal.

In addition, in some embodiments, in the case where the first pull-down control sub-circuit 104 does not operate and the second pull-down control sub-circuit 111 operates in this stage, referring to FIG. 6, the second pull-down control sub-circuit 111 transmits the voltage of the fifth voltage terminal V5 to the second pull-down node PD2 under the control of the voltage of the fifth voltage terminal V5. For example, as shown in FIG. 7, the fifteenth transistor M15 is turned off under the control of the low-level voltage of the pull-up node PU. The fourteenth transistor M14 is turned on under the control of the high-level voltage of the fifth voltage terminal V5 to transmit the high-level voltage of the fifth voltage terminal V5 to the second pull-down node PD2. In this case, the potential of the second pull-down node PD2 is at a high level.

Referring to FIG. 6, the fifth noise reduction sub-circuit 112 transmits the voltage of the second voltage terminal V2 to the pull-up node PU under the control of the voltage of the second pull-down node PD2. For example, as shown in FIG. 7, the sixteenth transistor M16 is turned on under the control of the high-level voltage of the second pull-down node PD2 to transmit the low-level voltage of the second voltage terminal V2 to the pull-up node PU, so that the potential of the pull-up node PU is at a low level.

Referring to FIG. 6, the sixth noise reduction sub-circuit 113 transmits the voltage of the fourth voltage terminal V4 to the first scan signal output terminal OUT1 under the control of the second pull-down node PD2, so as to denoise the first scan signal output terminal OUT1. For example, as shown in FIG. 7, the seventeenth transistor M17 is turned on under the control of the high-level voltage of the second pull-down node PD2 to transmit the low-level voltage of the fourth voltage terminal V4 to the first scan signal output terminal OUT1. In this case, the first scan signal output terminal OUT1 is a low-level signal.

Referring to FIG. 6, the seventh noise reduction sub-circuit 114 transmits the voltage of the second voltage terminal V2 to the shift signal output terminal CR under the control of the voltage of the second pull-down node PD2, so as to denoise the shift signal output terminal CR. For example, as shown in FIG. 7, the eighteenth transistor M18 is turned on under the control of the high-level voltage of the second pull-down node PD2 to transmit the low-level voltage of the second voltage terminal V2 to the shift signal output terminal CR. In this case, the signal of the shift signal output terminal CR is a low-level signal.

Referring to FIG. 6, in the case where the output sub-circuit 102 is further coupled to the second scan signal output terminal OUT2, the eighth noise reduction sub-circuit 115 is turned on under the control of the voltage of the second pull-down node PD2 to transmit the voltage of the fourth voltage terminal V4 to the second scan signal output terminal OUT2, so as to denoise the second scan signal output terminal OUT2. For example, as shown in FIG. 7, the nineteenth transistor M19 is turned on under the control of the high-level voltage of the second pull-down node PD2 to transmit the low-level voltage of the fourth voltage terminal V4 to the second scan signal output terminal OUT2. In this case, the signal of the second scan signal output terminal OUT2 is a level signal.

Figure 16:
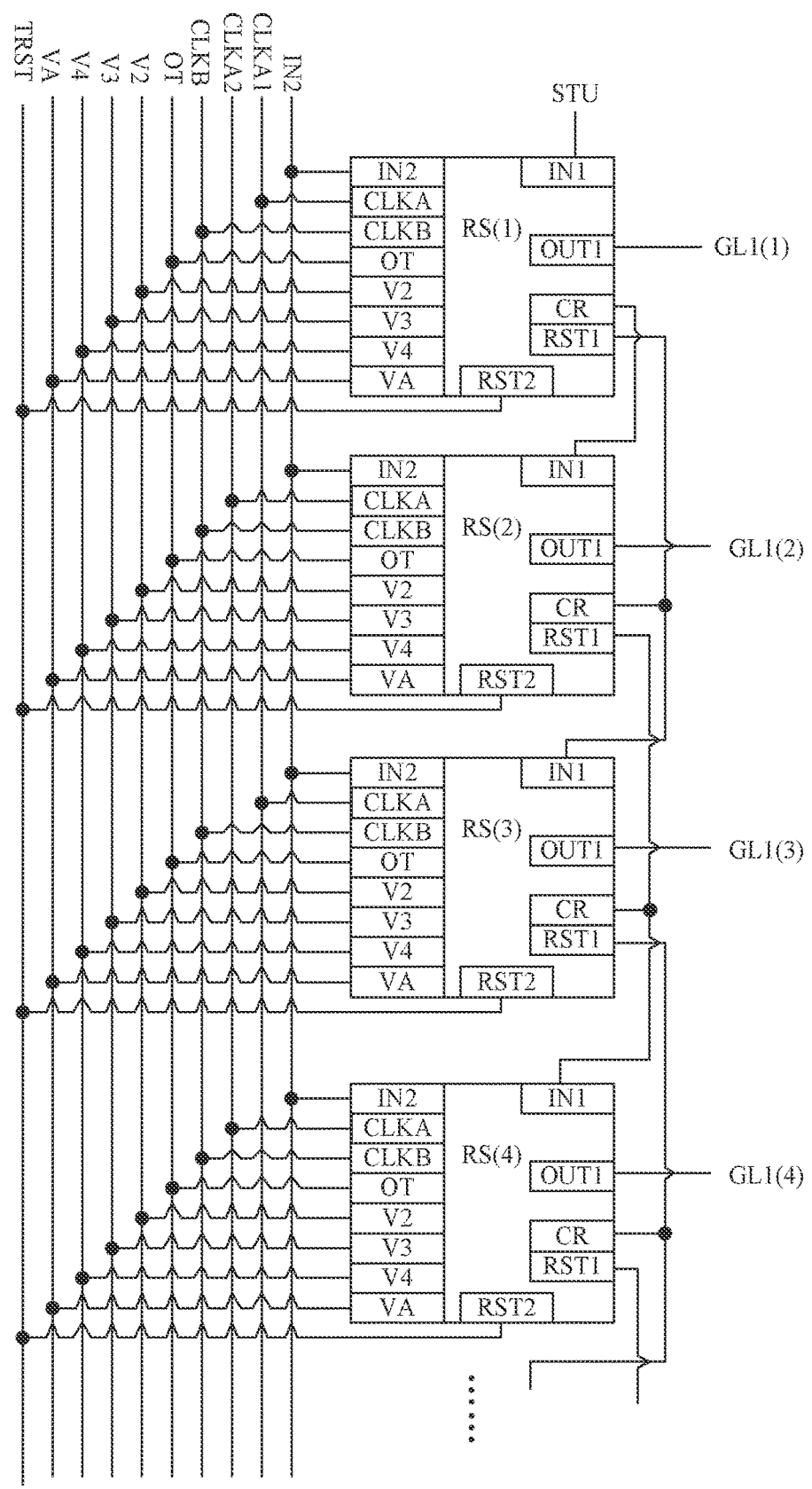
FIG. 16 is a diagram showing a structure of a gate driver circuit, in accordance with some embodiments.

Some embodiments of the present disclosure provide a gate driver circuit 10. As shown in FIG. 16, the gate driver circuit includes a plurality of shift register circuits (RS(1) . . . RS(N)) provided in any one of the above embodiments connected in cascade.

For example, as shown in FIG. 16, a first signal input terminal IN1 of a first-stage shift register circuit RS(1) is coupled to a start signal line STU. The start signal line STU is configured to transmit a start signal, and the first-stage shift register circuit RS(1) in the gate driver circuit 10 starts operating after receiving the start signal. Second reset terminals RST2 of all of the shift register circuits RS are coupled to a reset signal line TRST.

Figure 17:
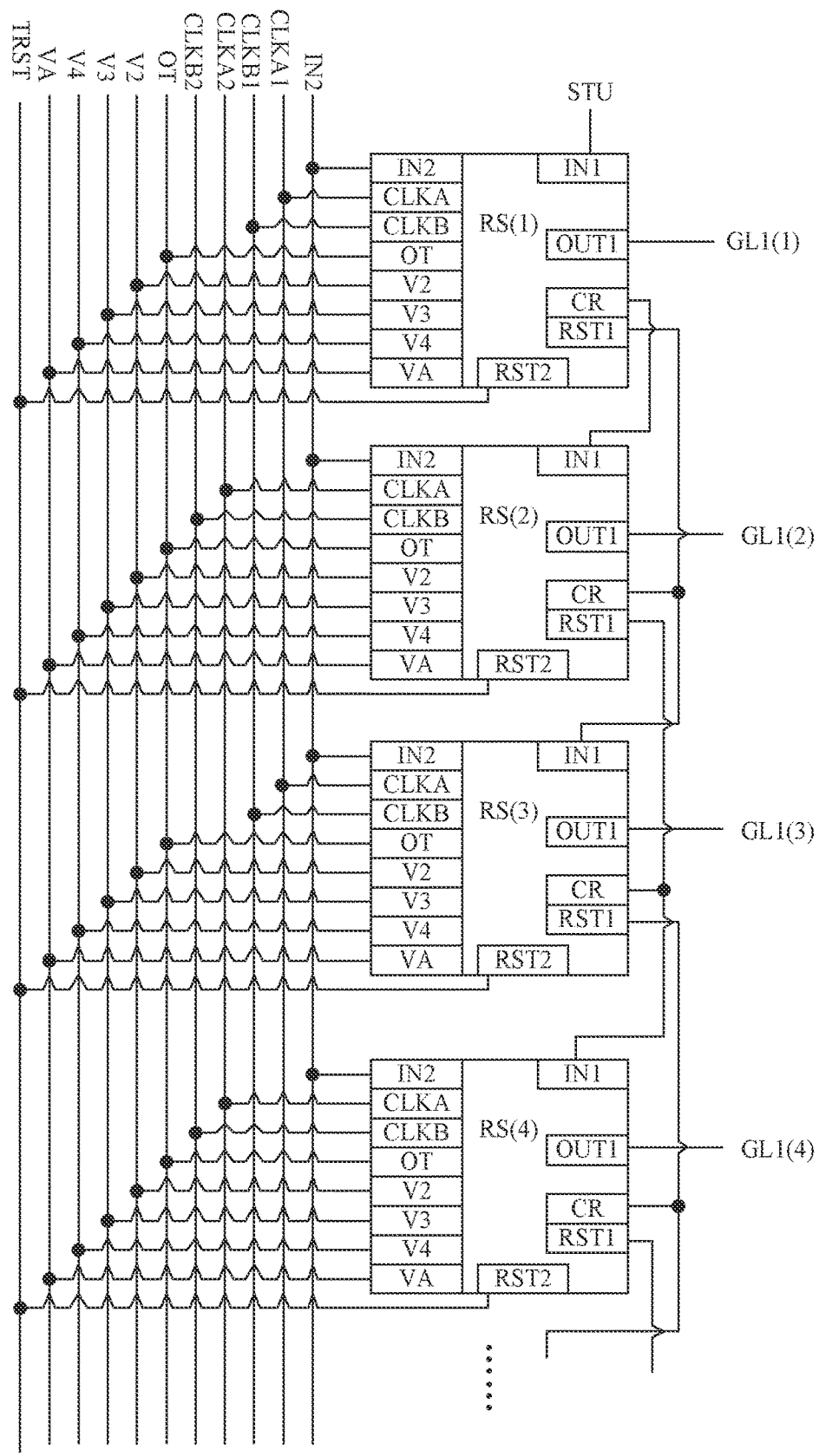
FIG. 17 is a diagram showing a structure of another gate driver circuit, in accordance with some embodiments.

In some embodiments, in a case where the gate driver circuit 10 includes the shift register circuits RS as shown in FIG. 3, as shown in FIGS. 16 and 17, the shift register circuits are cascaded sequentially.

Except for the first-stage shift register circuit RS(1), a first signal input terminal IN1 of each stage of shift register circuit is coupled to a shift signal output terminal CR of a shift register circuit in a previous stage. Except for a last-stage shift register circuit RS(N), a first reset signal terminal RST1 of each stage of shift register circuit is coupled to a shift signal output terminal CR of a shift register circuit in a next stage. In this case, a first reset signal terminal RST1 of the last-stage shift register circuit RS may be coupled to the start signal line STU. In this way, when the start signal line STU transmits the start signal to the first signal input terminal IN1 of the first-stage shift register circuit RS(1), the first reset signal terminal RST1 of the last-stage shift register circuit RS(N) receives the start signal to reset the last-stage shift register circuit RS(N).

It will be noted that, as shown in FIGS. 16 and 17, any adjacent two shift register circuits RS connected in cascade are coupled to different first clock signal lines. For example, first clock signal terminals CLKA of shift register circuits in odd-numbered stages are coupled to a first first clock signal line CLKA1, and first clock signal terminals CLKA of shift register circuits in even-numbered stages are coupled to a second first clock signal line CLKA2. A signal transmitted by the first first clock signal line CLKA1 and a signal transmitted by the second first clock signal line CLKA2 have a certain phase difference therebetween.

In the gate driver circuit 10 as shown in FIG. 16, a second clock signal terminal CLKB of each shift register circuit RS is coupled to a same second clock signal line CLKB. Or, in the gate driver circuit 10 as shown in FIG. 17, second clock signal terminals CLKB of the shift register circuits in the odd-numbered stages are coupled to a first second clock signal line CLKB1, and second clock signal terminals CLKB of the shift register circuits in the even-numbered stages are coupled to a second second clock signal line CLKB2. A signal transmitted by the first second clock signal line CLKB1 and a signal transmitted by the second second clock signal line CLKB2 have a certain phase difference therebetween.

In some embodiments, in a case where output signals of first scan signal output terminals OUT1 of the shift register circuits RS in the gate driver circuit 10 overlap, second clock signal terminals CLKB in the shift register circuits RS that output overlapped signals receive different signals. In this case, the number of second clock signal lines CLKB required for the gate driver circuit 10 is greater than or equal to the number of shift register circuits RS with overlapped output signals of the first scan signal output terminal OUT1. In this way, in a case where a waveform of a signal of a first scan signal output terminal OUT1 of a single shift register circuit RS is chamfered, it is possible to avoid a problem that a normal output of shift register circuits RS that output overlapped signals is affected in a case where a same second clock signal line CLKB is used.

It will be noted that, a person skilled in the art may adjust a phase of the signal received by the second clock signal terminal CLKB of each shift register circuit according to the output of each shift register circuit, and adjust a duty cycle of the signal transmitted by the second clock signal line coupled to each shift register circuit, so as to ensure the normal output of each shift register circuit.

Figure 18:
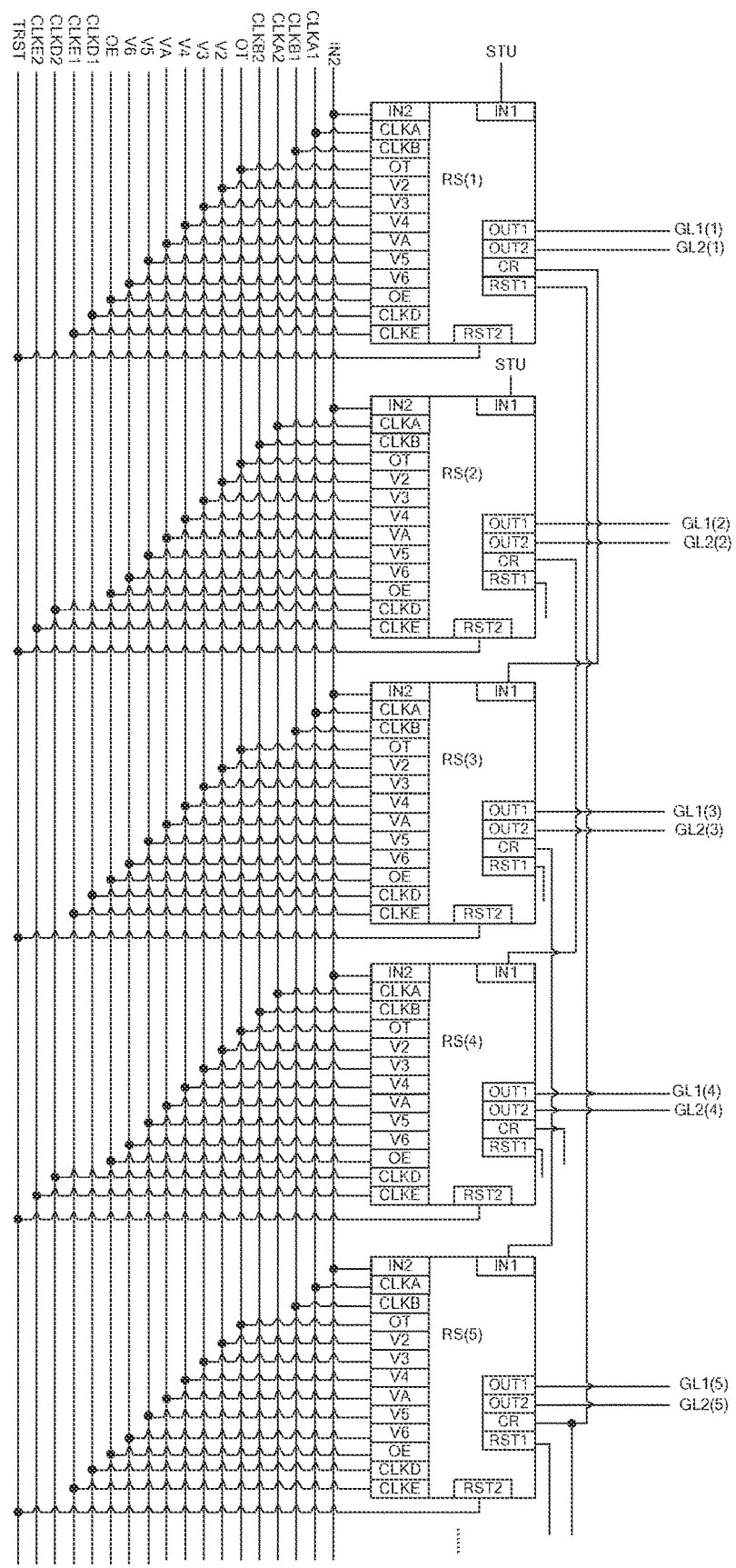
FIG. 18 is a diagram showing a structure of yet another gate driver circuit, in accordance with some embodiments.

In some embodiments, in a case where the gate driver circuit 10 includes the shift register circuit RS as shown in FIG. 6, a first signal input terminal IN1 of a j-th-stage shift register circuit RS(j) is coupled to a shift signal output terminal CR of a (j−2)-th-stage shift register circuit RS(j−2), and a first reset terminal RST1 of the j-th-stage shift register circuit RS(j) is coupled to a shift signal output terminal CR of a (j+4)-th-stage shift register circuit RS(j+4). Herein, j is greater than or equal to 3 and less than or equal to N (3≤j≤N), and is a positive integer. For example, as shown in FIG. 18, a first signal input terminal IN1 of a third-stage shift register circuit RS(3) is coupled to a shift signal output terminal CR of the first-stage shift register circuit RS(1), and a first signal input terminal IN1 of a fifth-stage shift register circuit RS(5) is coupled to a shift signal output terminal CR of a third-stage shift register circuit RS(3). A reset signal terminal RST1 of the first-stage shift register circuit RS(1) is coupled to a shift signal output terminal CR of the fifth-stage shift register circuit RS(5). In this case, the first signal input terminal IN1 of the first-stage shift register circuit RS(1) and a first signal input terminal IN1 of a second-stage shift register circuit RS(2) are both coupled to the start signal line STU. In this case, the start signal transmitted by the start signal line STU is used to control operations of the first-stage shift register circuit RS(1) and the second-stage shift register circuit RS(2).

In addition, any adjacent two cascaded shift register circuits RS are coupled to different fourth clock signal lines and fifth clock signal lines. For example, as shown in FIG. 18, fourth clock signal terminals CLKD of the shift register circuits in the odd-numbered stages are coupled to a first fourth clock signal line CLKD1, and fourth clock signal terminals CLKD of the shift register circuits in the even-numbered stages are coupled to a second fourth clock signal line CLKD2. A signal transmitted by the first fourth clock signal line CLKD1 and a signal transmitted by the second fourth clock signal line CLKD2 have a certain phase difference therebetween. Fifth clock signal terminals CLKE of the shift register circuits in the odd-numbered stages are coupled to a first fifth clock signal line CLKE, and fifth clock signal terminals CLKE of the shift register circuits in the even-numbered stages are coupled to a second fifth clock signal line CLKE2. A signal transmitted by the first fifth clock signal line CLKE1 and a signal transmitted by the second fifth clock signal line CLKE2 have a certain phase difference therebetween.

Figure 19:
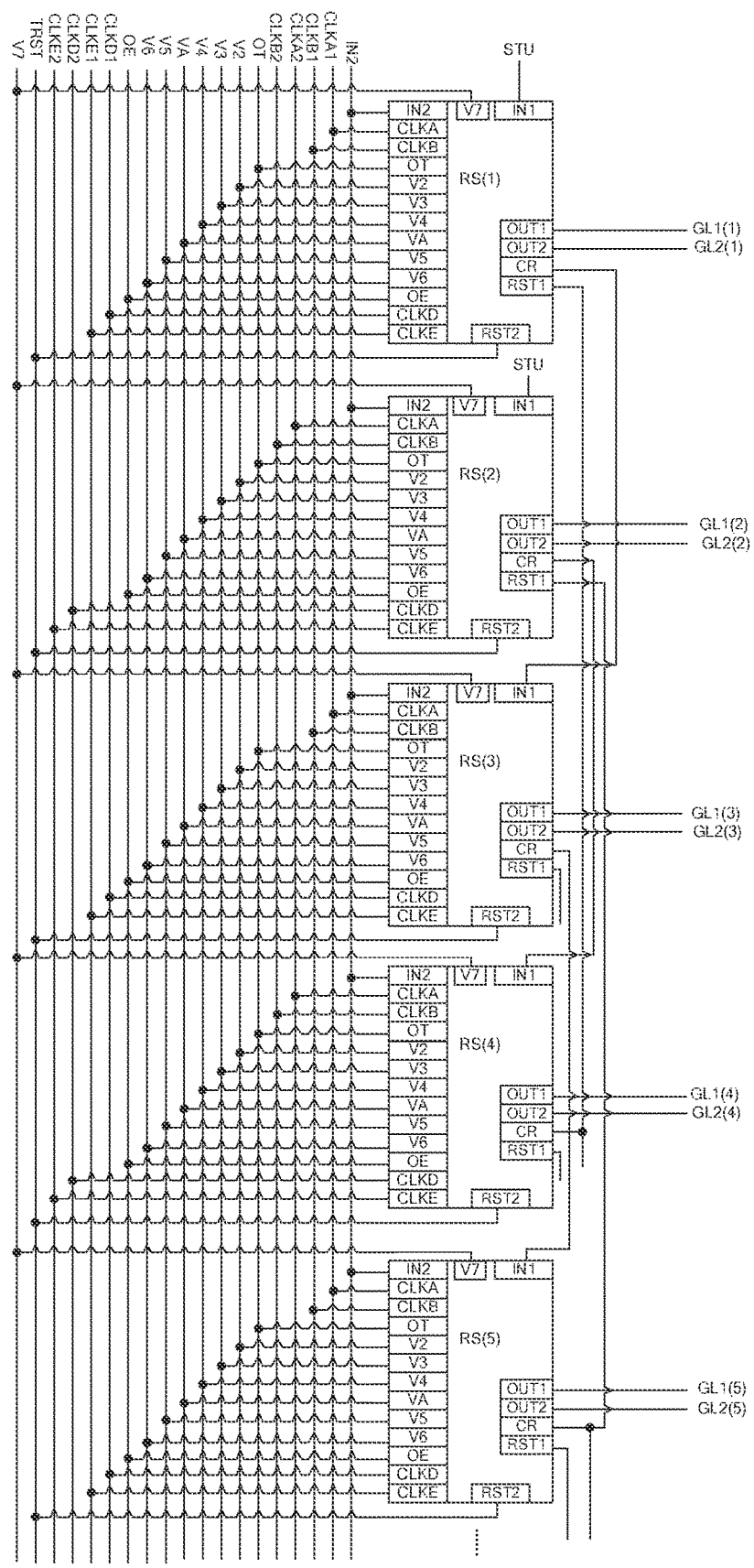
FIG. 19 is a diagram showing a structure of yet another gate driver circuit, in accordance with some embodiments.

In some embodiments, in a case where the gate driver circuit 10 includes the shift register circuit RS as shown in FIG. 11, the first signal input terminal IN1 of the j-th-stage shift register circuit RS(j) is coupled to the (j−2)-th-stage shift register circuit RS(j−2), and the first reset signal terminal RST1 of the j-th-stage shift register circuit RS(j) is coupled to a (j+3)-th-stage shift register circuit RS(j+3). Herein, j is greater than or equal to 3 and less than or equal to N (3≤j≤N), and is a positive integer. For example, as shown in FIG. 19, the first signal input terminal IN1 of the third-stage shift register circuit RS(3) is coupled to the shift signal output terminal CR of the first-stage shift register circuit RS(1), and the first signal input terminal IN1 of the fifth-stage shift register circuit RS(5) is coupled to the shift signal output terminal CR of the third-stage shift register circuit RS(3). The first reset signal terminal RST1 of the first-stage shift register circuit RS(1) is coupled to a shift signal output terminal CR of a fourth-stage shift register circuit RS(4), and a first reset signal terminal RST1 of the second-stage shift register circuit RS(2) is coupled to the shift signal output terminal CR of the fifth-stage shift register circuit RS(5).

It will be noted that, for convenience of description, some signal terminals, signals transmitted by the some signal terminals and signal lines coupled to the some signal terminals are indicated by the same reference symbols, but have different properties.

Some embodiments of the present disclosure provide a display apparatus. The display apparatus may be any device that can display an image whether moving (such as a video) or fixed (such as a static image), and whether literal or graphical. More specifically, it is contemplated that the described embodiments may be implemented in or associated with a variety of electronic devices. The variety of electronic devices may include (but are not limited to), for example, mobile telephones, wireless devices, portable digital devices (PDA), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (such as odometer display), navigators, cockpit controllers and/or displays, camera view displays (such as rear view camera display in a vehicle), electronic photos, electronic billboards or signages, projectors, building structures, packaging and aesthetic structures (such as a display for an image of a piece of jewelry), etc.

In some embodiments, the display apparatus includes the display panel 100 as shown in FIG. 1. The display panel 100 includes the gate driver circuit 10 provided in any one of the above embodiments.

It will be note that, for the gate driver circuit 10, FIG. 1 is only an illustration by taking a single-sided driving (that is, the gate driver circuit 10 is provided in the peripheral area S of the display panel 100 and located on a single side of the active area, and the first scan signal lines GL1 and the second scan signal lines GL2 are sequentially scanned line by line from the single side) as an example. In some other embodiments, a double-sided simultaneous driving (that is, two gate driver circuits 10 are provided in the peripheral area S of the display panel 100 and each gate driver circuit 10 is located on a respective one of two sides of the active area along an extending direction of the first scan signal lines GL1 and the second scan signal lines GL2, and the first scan signal lines GL1 and the second scan signal lines GL2 are sequentially scanned line by line from the two sides simultaneously through the two gate driver circuits 10) may be adopted. In yet some other embodiments, a double-sided alternate driving (that is, two gate driver circuits 10 are provided in the peripheral area S of the display panel 100 and each gate driver circuit 10 is located on a respective one of two sides of the active area along an extending direction of the first scan signal lines GL1 and the second scan signal lines GL2, and the first scan signal lines GL1 and the second scan signal lines GL2 are sequentially scanned line by line from the two sides alternately through the two gate driver circuits 10) may be adopted in the display panel 100.

It will be note that, the gate driver circuit 10 provided in the embodiments of the present disclosure is described by taking the single-sided driving as an example.

In addition, in the gate driver circuit 10, a multi-clock signals mode may be adopted in the clock signal terminals in the shift register circuits RS. For example, a two-clock signals mode, a four-clock signals mode, a six-clock signals mode, an eight-clock signals mode or a ten-clock signals mode may be adopted, which is not limited in the present disclosure. The gate driver circuit 10 provided in the embodiments of the present disclosure is described by taking the two-clock signals model as an example.

Some embodiments of the present disclosure provide a method of driving the shift register circuit RS according to any one of the embodiments above. As shown in FIG. 3, the method includes:

transmitting, by the first input sub-circuit 101, the signal received at the second signal input terminal IN2 to the pull-up node PU under the control of the signal received at the first signal input terminal IN1;

transmitting, by the output sub-circuit 102, the signal received at the first clock signal terminal CLKA to the shift signal output terminal CR, and the signal received at the output signal transmission terminal OT to the first scan signal output terminal OUT1 in response to the voltage of the pull-up node PU; and transmitting, by the output control sub-circuit 103, the signal received at the chamfering signal terminal VA to the first scan signal output terminal OUT1 in response to the signal received at the second clock signal terminal CLKB in the predetermined time before the first scan signal output terminal OUT1 stops outputting the signal from the output signal transmission terminal OT.

The voltage amplitude of the signal received at the chamfering signal terminal VA is within the variation range of the voltage amplitude of the signal of the first scan signal output terminal OUT1.

The method of driving the shift register circuit RS has the same beneficial effects as the shift register circuit RS described above, and details will not be repeated here.

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A shift register circuit, comprising:
   a first input sub-circuit coupled to a first signal input terminal, a second signal input terminal and a pull-up node, the first input sub-circuit being configured to transmit a signal received at the second signal input terminal to the pull-up node under control of a signal received at the first signal input terminal;
   an output sub-circuit at least coupled to the pull-up node, a first clock signal terminal, an output signal transmission terminal, a shift signal output terminal and a first scan signal output terminal, the output sub-circuit being configured to transmit a signal received at the first clock signal terminal to the shift signal output terminal and to transmit a signal received at the output signal transmission terminal to the first scan signal output terminal in response to a voltage of the pull-up node;
   an output control sub-circuit coupled to a second clock signal terminal, a chamfering signal terminal and the first scan signal output terminal, the output control sub-circuit being configured to transmit a signal received at the chamfering signal terminal to the first scan signal output terminal in response to a signal received at the second clock signal terminal in a predetermined time before the first scan signal output terminal stops outputting the signal from the output signal transmission terminal;

a second input sub-circuit coupled to a control signal terminal, the first signal input terminal and a first node, the second input sub-circuit being configured to transmit the signal received at the first signal input terminal to the first node under control of a signal received at the control signal terminal;

a compensation sub-circuit coupled to a fifth clock signal terminal, the first node and the pull-up node, the compensation sub-circuit being configured to transmit a signal received at the fifth clock signal terminal to the pull-up node under control of a voltage of the first node and the signal received at the fifth clock signal terminal;

a storage sub-circuit coupled to a sixth voltage terminal and the first node, the storage sub-circuit being configured to store a signal that is transmitted to the first node from the first signal input terminal;

a first potential boosting sub-circuit coupled to a seventh voltage terminal, the pull-up node and a second node, the first potential boosting sub-circuit being configured to transmit a voltage of the seventh voltage terminal to the second node under control of the voltage of the pull-up node; wherein the second node is coupled to the compensation sub-circuit and a second potential boosting sub-circuit coupled to the seventh voltage terminal, the first node and the second input sub-circuit, the second potential boosting sub-circuit being configured to transmit the voltage of the seventh voltage terminal to the second input sub-circuit under the control of the voltage of the first node;

wherein the chamfering signal terminal is configured to transmit a signal with a voltage amplitude within a variation range of a voltage amplitude of a signal of the first scan signal output terminal.

2. The shift register circuit according to claim 1, wherein the output control sub-circuit includes:

a first transistor, a control electrode of the first transistor being coupled to the second clock signal terminal, a first electrode of the first transistor being coupled to the chamfering signal terminal, and a second electrode of the first transistor being coupled to the first scan signal output terminal;

the first input sub-circuit includes:

a second transistor, a control electrode of the second transistor being coupled to the first signal input terminal, a first electrode of the second transistor being coupled to the second signal input terminal, and a second electrode of the second transistor being coupled to the pull-up node; and the output sub-circuit includes:

a third transistor, a control electrode of the third transistor being coupled to the pull-up node or the shift signal output terminal, a first electrode of the third transistor being coupled to the output signal transmission terminal, and a second electrode of the third transistor being coupled to the first scan signal output terminal; and a fourth transistor, a control electrode of the fourth transistor being coupled to the pull-up node, a first electrode of the fourth transistor being coupled to the first clock signal terminal, and a second electrode of the fourth transistor being coupled to the shift signal output terminal;

wherein in a case where the control electrode of the third transistor is coupled to the pull-up node, the output signal transmission terminal is a third clock signal terminal; or in a case where the control electrode of the third transistor is coupled to the shift signal output terminal, the output signal transmission terminal is a first voltage terminal.

3. The shift register circuit according to claim 2, wherein the output sub-circuit further includes a first capacitor;

in the case where the control electrode of the third transistor is coupled to the pull-up node, a first terminal of the first capacitor is coupled to the pull-up node and the control electrode of the third transistor, and a second terminal of the first capacitor is coupled to the first scan signal output terminal and the second electrode of the third transistor; or, a first terminal of the first capacitor is coupled to the pull-up node and the control electrode of the fourth transistor, and a second terminal of the first capacitor is coupled to the shift signal output terminal and the second electrode of the fourth transistor; or in the case where the control electrode of the third transistor is coupled to the shift signal output terminal, a first terminal of the first capacitor is coupled to the pull-up node and the control electrode of the fourth transistor, a second terminal of the first capacitor is coupled to the shift signal output terminal and the second electrode of the fourth transistor.

4. The shift register circuit according to claim 1, wherein the output sub-circuit is further coupled to a fourth clock signal terminal and a second scan signal output terminal;

the output sub-circuit is further configured to transmit a signal received at the fourth clock signal terminal to the second scan signal output terminal in response to the voltage of the pull-up node.

5. The shift register circuit according to claim 4, wherein the output sub-circuit includes:

a fifth transistor, a control electrode of the fifth transistor being coupled to the pull-up node, a first electrode of the fifth transistor being coupled to the fourth clock signal terminal, and a second electrode of the fifth transistor being coupled to the second scan signal output terminal; and a second capacitor, a first terminal of the second capacitor being coupled to the pull-up node and the control electrode of the fifth transistor, a second terminal of the second capacitor being coupled to the second scan signal output terminal and the second electrode of the fifth transistor.

6. The shift register circuit according to claim 1, further comprising:

a first pull-down control sub-circuit coupled to the pull-up node, a first pull-down node, a second voltage terminal and a third voltage terminal, the first pull-down control sub-circuit being configured to transmit a voltage of the second voltage terminal to the first pull-down node under control of a voltage of the first pull-down node, and to transmit a voltage of the third voltage terminal to the first pull-down node under control of the voltage of the third voltage terminal;

a first noise reduction sub-circuit coupled to the pull-up node, the first pull-down node and the second voltage terminal, the first noise reduction sub-circuit being configured to transmit the voltage of the second voltage terminal to the pull-up node under control of a voltage of the first pull-down node;

a second noise reduction sub-circuit coupled to the first scan signal output terminal, the first pull-down node and a fourth voltage terminal, the second noise reduction sub-circuit being configured to transmit a voltage of the fourth voltage terminal to the first scan signal output terminal under the control of the voltage of the first pull-down node;

a third noise reduction sub-circuit coupled to the shift signal output terminal, the first pull-down node and the second voltage terminal, the third noise reduction sub-circuit being configured to transmit the voltage of the second voltage terminal to the shift signal output terminal under the control of the voltage of the first pull-down node; and a first reset sub-circuit coupled to the pull-up node, a first reset signal terminal and the second voltage terminal, the first reset sub-circuit being configured to transmit the voltage of the second voltage terminal to the pull-up node under control of a signal received at the first reset signal terminal.

7. The shift register circuit according to claim 6, further comprising at least one of:
a fourth noise reduction sub-circuit coupled to a second scan signal output terminal, the first pull-down node and the fourth voltage terminal, the fourth noise reduction sub-circuit being configured to transmit the voltage of the fourth voltage terminal to the second scan signal output terminal under the control of the voltage of the first pull-down node; or
a second reset sub-circuit coupled to a second reset signal terminal, the pull-up node and the second voltage terminal, the second reset sub-circuit being configured to transmit the voltage of the second voltage terminal to the pull-up node under control of a signal received at the second reset signal terminal;
wherein the output sub-circuit is further coupled to the second scan signal output terminal.

8. The shift register circuit according to claim 7, wherein the fourth noise reduction sub-circuit includes:
a twelfth transistor, a control electrode of the twelfth transistor being coupled to the first pull-down node, a first electrode of the twelfth transistor being coupled to the fourth voltage terminal, and a second electrode of the twelfth transistor being coupled to the second scan signal output terminal; and
the second reset sub-circuit includes:
a thirteenth transistor, a control electrode of the thirteenth transistor being coupled to the second reset signal terminal, a first electrode of the thirteenth transistor being coupled to the second voltage terminal, and a second electrode of the thirteenth transistor being coupled to the pull-up node.

9. The shift register circuit according to claim 6, wherein the first pull-down control sub-circuit includes:
a sixth transistor, a control electrode and a first electrode of the sixth transistor being coupled to the third voltage terminal, and a second electrode of the sixth transistor being coupled to the first pull-down node; and
a seventh transistor, a control electrode of the seventh transistor being coupled to the pull-up node, a first electrode of the seventh transistor being coupled to the second voltage terminal, and a second electrode of the seventh transistor being coupled to the first pull-down node;

the first noise reduction sub-circuit includes:
an eighth transistor, a control electrode of the eighth transistor being coupled to the first pull-down node, a first electrode of the eighth transistor being coupled to the second voltage terminal, and a second electrode of the eighth transistor being coupled to the pull-up node;
the second noise reduction sub-circuit includes:
a ninth transistor, a control electrode of the ninth transistor being coupled to the first pull-down node, a first electrode of the ninth transistor being coupled to the fourth voltage terminal, and a second electrode of the ninth transistor being coupled to the first scan signal output terminal;
the third noise reduction sub-circuit includes:
a tenth transistor, a control electrode of the tenth transistor being coupled the first pull-down node, a first electrode of the tenth transistor being coupled to the second voltage terminal, and a second electrode of the tenth transistor being coupled to the shift signal output terminal; and
the first reset sub-circuit includes:
an eleventh transistor, a control electrode of the eleventh transistor being coupled to the first reset signal terminal, a first electrode of the eleventh transistor being coupled to the second voltage terminal, and a second electrode of the eleventh transistor being coupled to the pull-up node.

10. The shift register circuit according to claim 6, further comprising:
a second pull-down control sub-circuit coupled to the pull-up node, a second pull-down node, the second voltage terminal and a fifth voltage terminal, the second pull-down control sub-circuit being configured to transmit the voltage of the second voltage terminal to the second pull-down node under control of the voltage of the pull-up node, and to transmit a voltage of the fifth voltage terminal to the second pull-down node under control of the voltage of the fifth voltage terminal;
a fifth noise reduction sub-circuit coupled to the pull-up node, the second pull-down node and the second voltage terminal, the fifth noise reduction sub-circuit being configured to transmit the voltage of the second voltage terminal to the pull-up node under control of a voltage of the second pull-down node;
a sixth noise reduction sub-circuit coupled to the first scan signal output terminal, the second pull-down node and the fourth voltage terminal, the sixth noise reduction sub-circuit being configured to transmit the voltage of the fourth voltage terminal to the first scan signal output terminal under control of the voltage of the second pull-down node; and
a seventh noise reduction sub-circuit coupled to the shift signal output terminal, the second pull-down node and the second voltage terminal, the seventh noise reduction sub-circuit being configured to transmit the voltage of the second voltage terminal to the shift signal output terminal under control of the voltage of the second pull-down node;
or, further comprising:
a second pull-down control sub-circuit coupled to the pull-up node, a second pull-down node, the second voltage terminal and a fifth voltage terminal, the second pull-down control sub-circuit being configured to transmit the voltage of the second voltage terminal to the second pull-down node under control of the voltage of the pull-up node, and to transmit a voltage of the fifth voltage terminal to the second pull-down node under control of the voltage of the fifth voltage terminal;

a fifth noise reduction sub-circuit coupled to the pull-up node, the second pull-down node and the second voltage terminal, the fifth noise reduction sub-circuit being configured to transmit the voltage of the second voltage terminal to the pull-up node under control of a voltage of the second pull-down node;

a sixth noise reduction sub-circuit coupled to the first scan signal output terminal, the second pull-down node and the fourth voltage terminal, the sixth noise reduction sub-circuit being configured to transmit the voltage of the fourth voltage terminal to the first scan signal output terminal under control of the voltage of the second pull-down node;

a seventh noise reduction sub-circuit coupled to the shift signal output terminal, the second pull-down node and the second voltage terminal, the seventh noise reduction sub-circuit being configured to transmit the voltage of the second voltage terminal to the shift signal output terminal under control of the voltage of the second pull-down node; and an eighth noise reduction sub-circuit coupled to a second scan signal output terminal, the second pull-down node and the fourth voltage terminal, the eighth noise reduction sub-circuit being configured to transmit the voltage of the fourth voltage terminal to the second scan signal output terminal under control of the voltage of the second pull-down node;

wherein the output sub-circuit is further coupled to the second scan signal output terminal.

11. The shift register circuit according to claim 10, wherein the second pull-down control sub-circuit includes:
a fourteenth transistor, a control electrode and a first electrode of the fourteenth transistor being coupled to the fifth voltage terminal, and a second electrode of the fourteenth transistor being coupled to the second pull-down node; and
a fifteenth transistor, a control electrode of the fifteenth transistor being coupled to the pull-up node, a first electrode of the fifteenth transistor being coupled to the second voltage terminal, and a second electrode of the fifteenth transistor being coupled to the second pull-down node;

the fifth noise reduction sub-circuit includes:
a sixteenth transistor, a control electrode of the sixteenth transistor being coupled to the second pull-down node, a first electrode of the sixteenth transistor being coupled to the second voltage terminal, and a second electrode of the sixteenth transistor being coupled to the pull-up node;

the sixth noise reduction sub-circuit includes:
a seventeenth transistor, a control electrode of the seventeenth transistor being coupled to the second pull-down node, a first electrode of the seventeenth transistor being coupled to the fourth voltage terminal, and a second electrode of the seventeenth transistor being coupled to the first scan signal output terminal; and the seventh noise reduction sub-circuit includes:
an eighteenth transistor, a control electrode of the eighteenth transistor being coupled to the second pull-down node, a first electrode of the eighteenth transistor being coupled to the second voltage terminal, and a second electrode of the eighteenth transistor being coupled to the shift signal output terminal.

12. The shift register circuit according to claim 10, wherein the eighth noise reduction sub-circuit includes:

a nineteenth transistor, a control electrode of the nineteenth transistor being coupled to the second pull-down node, a first electrode of the nineteenth transistor being coupled to the fourth voltage terminal, and a second electrode of the nineteenth transistor being coupled to the second scan signal output terminal.

13. The shift register circuit according to claim 1, wherein the second input sub-circuit includes:

a twentieth transistor, a control electrode of the twentieth transistor being coupled to the control signal terminal, a first electrode of the twentieth transistor being coupled to the first signal input terminal, and a second electrode of the twentieth transistor being coupled to the first node;

the compensation sub-circuit includes:
a twenty-first transistor, a control electrode of the twenty-first transistor being coupled to the first node, a first electrode of the twenty-first transistor being coupled to the fifth clock signal terminal; and
a twenty-second transistor, a control electrode of the twenty-second transistor being coupled to the fifth clock signal terminal, a first electrode of the twenty-second transistor being coupled to a second electrode of the twenty-first transistor, and a second electrode of the twenty-second transistor being coupled to the pull-up node;

the storage sub-circuit includes:
a third capacitor, a first terminal of the third capacitor being coupled to the sixth voltage terminal, and a second terminal of the third capacitor being coupled to the first node;

the first potential boosting sub-circuit includes:
a twenty-seventh transistor, a control electrode of the twenty-seventh transistor being coupled to the pull-up node, a first electrode of the twenty-seventh transistor being coupled to the seventh voltage terminal, and a second electrode of the twenty-seventh transistor being coupled to the second node; and the second potential boosting sub-circuit includes:
a twenty-eighth transistor, a control electrode of the twenty-eighth transistor being coupled to the first node, a first electrode of the twenty-eighth transistor being coupled to the seventh voltage terminal, and a second electrode of the twenty-eighth transistor being coupled to the second input sub-circuit.

14. The shift register according to claim 1, further comprising: a first pull-down control sub-circuit coupled to the pull-up node, a first pull-down node, a second voltage terminal and a third voltage terminal, the first pull-down control sub-circuit being configured to transmit a voltage of the second voltage terminal to the first pull-down node under control of a voltage of the first pull-down node, and to transmit a voltage of the third voltage terminal to the first pull-down node under control of the voltage of the third voltage terminal;

a first control sub-circuit coupled to a fifth clock signal terminal, the second voltage terminal and the first pull-down node, the first control sub-circuit being configured to transmit a voltage of the second voltage terminal to the first pull-down node under control of a signal received at the fifth clock signal terminal; and a second control sub-circuit coupled to the first signal input terminal, the second voltage terminal and the first pull-down node, the second control sub-circuit being configured to transmit the voltage of the second voltage terminal to the first pull-down node under the control of the signal received at the first signal input terminal.

15. The shift register circuit according to claim 14, further comprising:
- a second pull-down control sub-circuit coupled to the pull-up node, a second pull-down node, the second voltage terminal and a fifth voltage terminal, the second pull-down control sub-circuit being configured to transmit the voltage of the second voltage terminal to the second pull-down node under control of the voltage of the pull-up node, and to transmit a voltage of the fifth voltage terminal to the second pull-down node under control of the voltage of the fifth voltage terminal;
- a third control sub-circuit coupled to the fifth clock signal terminal, the second voltage terminal and the second pull-down node, the third control sub-circuit being configured to transmit a voltage of the second voltage terminal to the second pull-down node under control of the signal received at the fifth clock signal terminal; and
- a fourth control sub-circuit coupled to the first signal input terminal, the second voltage terminal and the second pull-down node, the fourth control sub-circuit being configured to transmit the voltage of the second voltage terminal to the second pull-down node under the control of the signal received at the first signal input terminal.

16. The shift register circuit according to claim 15, wherein
the first control sub-circuit includes:
- a twenty-third transistor, a control electrode of the twenty-third transistor being coupled to the fifth clock signal terminal, a first electrode of the twenty-third transistor being coupled to the second voltage terminal, and a second electrode of the twenty-third transistor being coupled to the first pull-down node; and the second control sub-circuit includes:
- a twenty-fourth transistor, a control electrode of the twenty-fourth transistor being coupled to the first signal input terminal, a first electrode of the twenty-fourth transistor being coupled to the second voltage terminal, and a second electrode of the twenty-fourth transistor being coupled to the first pull-down node;

the third control sub-circuit includes:
- a twenty-fifth transistor, a control electrode of the twenty-fifth transistor being coupled to the fifth clock signal terminal, a first electrode of the twenty-fifth transistor being coupled to the second voltage terminal, and a second electrode of the twenty-fifth transistor being coupled to the second pull-down node; and the fourth control sub-circuit includes:
- a twenty-sixth transistor, a control electrode of the twenty-sixth transistor being coupled to the first signal input terminal, a first electrode of the twenty-sixth transistor being coupled to the second voltage terminal, and a second electrode of the twenty-sixth transistor being coupled to the second pull-down node.

17. A gate driver circuit, comprising a plurality of shift register circuits according to claim 1 connected in cascade.

18. A display apparatus, comprising the gate driver circuit according to claim 17.

19. A method of driving the shift register circuit according to claim 1, the method comprising:
- transmitting, by the first input sub-circuit, the signal received at the second signal input terminal to the pull-up node under the control of the signal received at the first signal input terminal;
- transmitting, by the output sub-circuit, the signal received at the first clock signal terminal to the shift signal output terminal, and the signal received at the output signal transmission terminal to the first scan signal output terminal in response to the voltage of the pull-up node;
- transmitting, by the output control sub-circuit, the signal received at the chamfering signal terminal to the first scan signal output terminal in response to the signal received at the second clock signal terminal in the predetermined time before the first scan signal output terminal stops outputting the signal from the output signal transmission terminal;
- transmitting, by the second input sub-circuit, the signal received at the first signal input terminal to the first node under control of the signal received at the control signal terminal;
- transmitting, the compensation sub-circuit, the signal received at the fifth clock signal terminal to the pull-up node under control of the voltage of the first node and the signal received at the fifth clock signal terminal;
- storing, the storage sub-circuit, the signal that is transmitted to the first node from the first signal input terminal;
- transmitting, the first potential boosting sub-circuit, the voltage of the seventh voltage terminal to the second node under control of the voltage of the pull-up node; and
- transmitting, the second potential boosting sub-circuit, the voltage of the seventh voltage terminal to the second input sub-circuit under the control of the voltage of the first node;
- wherein the voltage amplitude of the signal received at the chamfering signal terminal is within the variation range of the voltage amplitude of the signal of the first scan signal output terminal.

* * * * *